US011476398B2

(12) United States Patent
Herrmann

(10) Patent No.: US 11,476,398 B2
(45) Date of Patent: Oct. 18, 2022

(54) SEMICONDUCTOR DISPLAY, OPTOELECTRONIC SEMICONDUCTOR COMPONENT AND METHOD FOR THE PRODUCTION THEREOF

(71) Applicant: OSRAM OLED GmbH, Regensburg (DE)

(72) Inventor: Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 355 days.

(21) Appl. No.: 16/624,913

(22) PCT Filed: Jun. 14, 2018

(86) PCT No.: PCT/EP2018/065866
§ 371 (c)(1),
(2) Date: Dec. 22, 2020

(87) PCT Pub. No.: WO2018/234160
PCT Pub. Date: Dec. 27, 2018

(65) Prior Publication Data
US 2021/0104649 A1    Apr. 8, 2021

(30) Foreign Application Priority Data

Jun. 21, 2017 (DE) ..................... 10 2017 113 745.9

(51) Int. Cl.
*H01L 33/62* (2010.01)
*H01L 33/00* (2010.01)
(Continued)

(52) U.S. Cl.
CPC .......... *H01L 33/62* (2013.01); *H01L 25/0753* (2013.01); *H01L 33/0093* (2020.05); *H01L 33/24* (2013.01); *H01L 2933/0066* (2013.01)

(58) Field of Classification Search
None
See application file for complete search history.

(56) References Cited

U.S. PATENT DOCUMENTS

| 10,535,709 B2* | 1/2020 | Hugon ................ H01L 33/502 |
| 2015/0263066 A1 | 9/2015 | Hu et al. |
| (Continued) | | |

FOREIGN PATENT DOCUMENTS

| DE | 102012109460 A1 | 4/2014 |
| DE | 102013104273 A1 | 10/2014 |
| FR | 3031238 A1 | 7/2016 |

OTHER PUBLICATIONS

German Search Report based on Application No. 10 2017 113 745.9, 8 pages, dated Apr. 10, 2018 (for reference purpose only).

(Continued)

*Primary Examiner* — Robert K Carpenter
(74) *Attorney, Agent, or Firm* — Viering, Jentschura & Partner mbB

(57) ABSTRACT

A semiconductor display may include a multiplicity of semiconductor pillars as well as first contact strips and second electrical contact strips. The semiconductor pillars each comprise a semiconductor core of a first conductivity type and a semiconductor shell of a second conductivity type different from the first conductivity type, as well as an active layer between them for radiation generation. The semiconductor pillars each comprise an energization shell which is applied onto the respective semiconductor shell for energization. The semiconductor pillars can be electrically driven independently of one another individually or in small groups by means of the first and second electrical contact strips.

19 Claims, 27 Drawing Sheets

(51) Int. Cl.
  *H01L 33/24*    (2010.01)
  *H01L 25/075*   (2006.01)

(56) References Cited

U.S. PATENT DOCUMENTS

2015/0279902 A1   10/2015   Von Malm et al.
2016/0087150 A1    3/2016   Ristic et al.
2017/0373118 A1   12/2017   Hugon

OTHER PUBLICATIONS

International Search Report based on Application No. PCT/EP2018/065866, 2 pages English Translation + 15 pages, dated Sep. 18, 2018 (for reference purpose only).

* cited by examiner

A)

B)

C)

D)

H)

I)

J)

K)

L)

A-A

M)

N)

O)

A)

B)

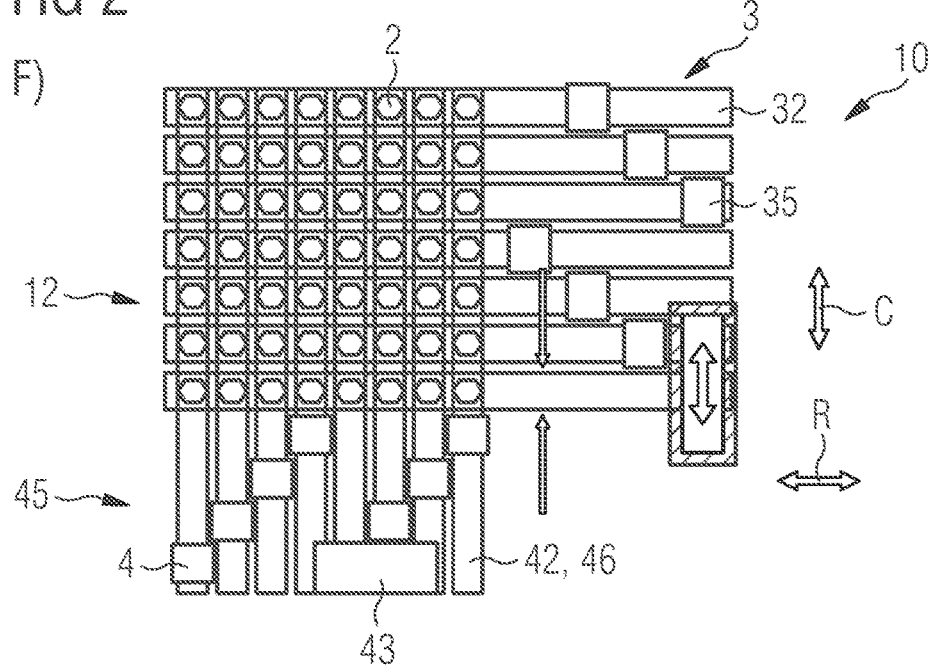
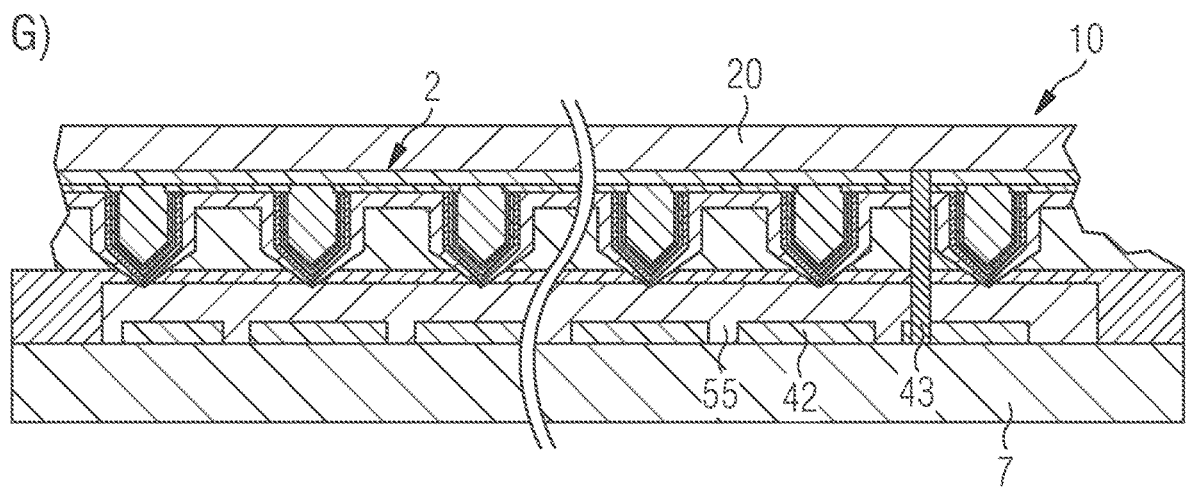
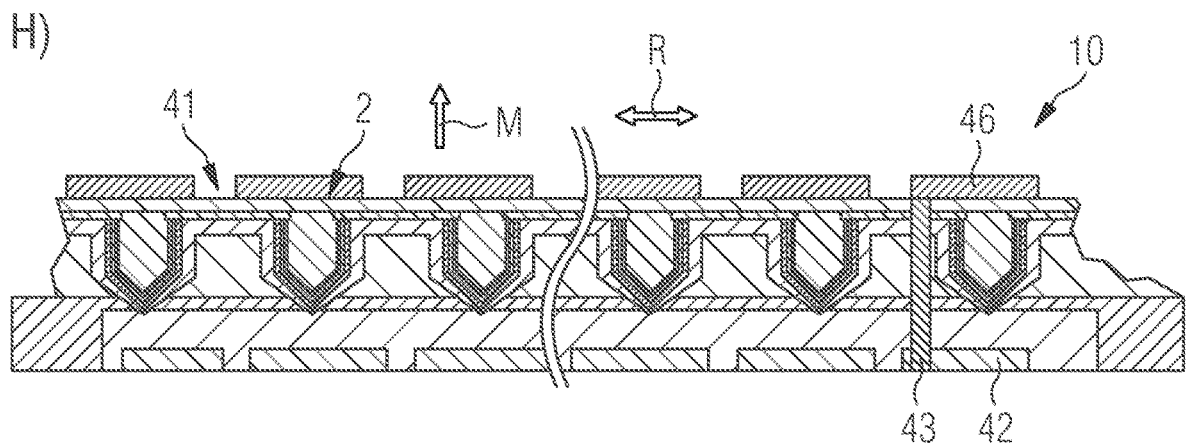

K)

L)

S)

A)

B)

C)

D)

E)

F)

G)

H)

P)

Q)

A)

B)

C)

D)

E)

J)

K)

L)

SEMICONDUCTOR DISPLAY, OPTOELECTRONIC SEMICONDUCTOR COMPONENT AND METHOD FOR THE PRODUCTION THEREOF

CROSS-REFERENCE TO RELATED APPLICATIONS

The present application is a national stage entry according to 35 U.S.C. § 371 of PCT application No.: PCT/EP2018/065866 filed on Jun. 14, 2018; which claims priority to German Patent Application Serial No.: 10 2017 113 745.9 filed on Jun. 21, 2017; both of which are incorporated herein by reference in their entirety and for all purposes.

TECHNICAL FIELD

A semiconductor display is provided. An optoelectronic semiconductor component is also provided. A method for the production thereof is furthermore provided.

BACKGROUND

An object to be achieved is to provide a semiconductor display that has a high resolution and can be manufactured efficiently.

SUMMARY

This object is achieved inter alia by a semiconductor display, by an optoelectronic semiconductor component and by a method, having the features of the independent patent claims.

According to at least one embodiment, the semiconductor display is used for the representation of images, in particular moving images. The semiconductor display is adapted for color representation. To this end, the semiconductor display includes a multiplicity of image points, also referred to as pixels. In particular, individual image points are adapted for different-color emission of light. The different-color light which is emitted by individual image points is composed of blue, red and green light.

According to at least one embodiment, the semiconductor display includes a multiplicity of semiconductor pillars. In particular, the image points are formed by the semiconductor pillars. In this case, each image point includes a plurality, but also possibly only one, of the semiconductor pillars. The semiconductor pillars may be electrically drivable independently of one another individually or combined in small groups. Small group means, for example, at most 25 or 16 or 10 or 4 of the semiconductor pillars.

According to at least one embodiment, the semiconductor display includes first and second electrical contact strips. The contact strips are column contacts and row contacts. The semiconductor pillars are electrically drivable by means of the contact strips.

According to at least one embodiment, the semiconductor pillars each include a semiconductor core of a first conductivity type. In particular, the semiconductor core is respectively made of n-doped semiconductor materials.

According to at least one embodiment, the semiconductor pillars each include a semiconductor shell made of a semiconductor material which has a second conductivity type different to the first. In particular, the semiconductor shells are made of a p-conductive semiconductor material.

According to at least one embodiment, the semiconductor pillars each include an active layer. The active layer, for example a single quantum well structure or a multiple quantum well structure, is located continuously between the respective semiconductor core and the associated semiconductor shell. The active layer is adapted for radiation generation, in particular for the generation of visible light such as blue light. It is possible for all the semiconductor pillars, and therefore all the active layers, to be configured with the same structure within the scope of the production tolerances, so that all the semiconductor pillars emit primary radiation of the same color. As an alternative, different semiconductor pillars have different active layers than one another for generating light of different colors and/or wavelengths.

According to at least one embodiment, the semiconductor pillars each include an energization shell. The energization shell is adapted for energization of the respective assigned semiconductor shell. The energization shells are made of a transparent conductive oxide, abbreviated to TCO, such as indium tin oxide or of one or more metals such as silver.

In at least one embodiment, the semiconductor display includes a multiplicity of semiconductor pillars as well as first and second electrical contact strips. The semiconductor pillars each include a semiconductor core of a first conductivity type and a semiconductor shell of a second conductivity type different to the first, as well as an active layer between them for radiation generation. The semiconductor pillars each include an energization shell which is applied onto the respective semiconductor shell for energization. The semiconductor pillars can be electrically driven independently of one another individually or in small groups by means of the first and second electrical contact strips.

With the display described here, individual image points with small dimensions may be produced and may be combined to form a module and/or may be used in the display. The reduction of possible dimensions for the individual image points is made possible by the use of the semiconductor pillars which can be electrically addressed individually or in small groups. In this case, the individual semiconductor pillars have areas in the range of about 1 $\mu m_2$ as seen in plan view.

With the method described here, for example, at least $1000 \times 1000 = 10^6$ semiconductor pillars per $mm^2$ may therefore be grown in the display described here. The semiconductor pillars may be present in this density in the display or may be expanded in terms of lateral distances, so that in the finished display there are larger distances between individual image points and semiconductor pillars. In this case, the semiconductor pillars have similar heights and diameters. In other words, an aspect ratio of a height and an average diameter of the semiconductor pillars is of the order of 1, although it may also be greater.

Alternative possibilities for the production of LED displays are to manufacture large individual semiconductor chips and structure them lithographically. However, because of the active zone which is then configured only two-dimensionally, unlike in the display described here, a luminance per unit area is limited. Furthermore, the difficulties increase when large-area continuous semiconductor layer sequences grow, unlike in the semiconductor pillars structured here. In conventional two-dimensional semiconductor layers, a size of individual image points is restricted to an edge length of about 10 $\mu m$, and therefore to an area of about 100 $\mu m^2$, in order to achieve sufficient levels of brightness. Conversely, an increase in the density of individually addressable semiconductor pillars and/or image points at least on a growth substrate by a factor of 100 may be achieved with the display described here.

According to at least one embodiment, the semiconductor display includes one or more casting bodies. The at least one casting body is opaque for the radiation generated. As an alternative, the casting body may be transmissive for radiation.

According to at least one embodiment, the semiconductor pillars are based on a III-V semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$, or alternatively an arsenide compound semiconductor material such as $Al_nIn_{1-n-m}Ga_mAs$ or such as $Al_nGa_mIn_{1-n-m}As_kP_{1-k}$, respectively $0 \leq n \leq 1$, $0 \leq m \leq 1$ and $n+m \leq 1$, as well as $0 \leq k < 1$. In a non-limiting embodiment, for at least one layer or for all the layers of the semiconductor layer sequence, in this case $0 < n \leq 0.8$, $0.4 \leq m < 1$ and $n+m \leq 0.95$, as well as $0 < k \leq 0.5$. In this case, the semiconductor layer sequence may include dopants and additional constituents. For the sake of simplicity, however, only the essential constituents of the crystal lattice of the semiconductor layer sequence are indicated, i.e. Al, As, Ga, In, N or P, even though these may be partially replaced and/or supplemented with small amounts of further materials. In a non-limiting embodiment, the semiconductor pillars are based on the material system AlInGaN.

According to at least one embodiment, the semiconductor display includes at least $10^4$ or $10^5$ or $10^6$ or $10^7$ of the semiconductor pillars. In this case, for example, three or four of the semiconductor pillars may be connected together to form an image point. A surface density of the semiconductor pillars on a growth substrate and/or in the finished display is, for example, at least $10^2$ or $10^3$ or $10^4$ or $10^6$ per $mm^2$.

According to at least one embodiment, the semiconductor pillars are located in recesses of the casting body. The recesses may be configured with the same shape as the semiconductor pillars, so that the recesses are filled fully or substantially fully by the semiconductor pillars, for example to at least 50% or 70% or 85%. In particular the recesses are filled with a form-fit and fully by the semiconductor pillars together with the associated energization shells. In this case, the energization shells may have a constant layer thickness. As an alternative, the recesses have a different base shape than the semiconductor pillars, for instance as seen in cross section, so that the recesses are filled only partially by the semiconductor pillars, for example to at most 30% or 50% or 70%.

According to at least one embodiment, an average diameter of the semiconductor pillars is at least 10 nm or 40 nm or 250 nm. As an alternative or in addition, the semiconductor pillars have an average diameter of at most 10 µm or 5 µm or 2 µm. In a non-limiting embodiment, the average diameter lies between 0.5 µm and 2 µm inclusive.

According to at least one embodiment, a ratio of an average height of the semiconductor pillars and the average diameter is at least 0.2 or 0.5 or 1. As an alternative or in addition, this ratio is at most 10 or 6 or 3 or 1.5. As an alternative, it is possible for this ratio to be relatively large, for example at least 3 or 5 or 7, in particular between 5 and 10 inclusive.

According to at least one embodiment, the semiconductor pillars are configured hexagonally. This means that the semiconductor pillars are, in particular, formed by regular hexagonal pillars and/or by hexagonal pyramids.

According to at least one embodiment, the semiconductor pillars are grown from a base region. Opposite the base region, there is a tip. The tip is pyramidal, particularly in the form of a regular hexagonal pyramid. As an alternative, it is possible for the tip to be rounded or flat.

According to at least one embodiment, energization of the semiconductor pillars takes place through the base regions. In particular, the base regions form an n-side of the semiconductor pillars. A semiconductor contact layer and/or a TCO contact layer for energization of the semiconductor pillars may be located on the base regions.

According to at least one embodiment, the active layer in each case extends continuously over side surfaces and/or the tip of the semiconductor pillars. As an alternative, the active layer may be limited to particular subregions of the side surfaces and/or of the tip of the semiconductor pillar in question.

According to at least one embodiment, the first contact strips extend perpendicularly, or approximately perpendicularly, to the second contact strips as seen in plan view. Column contacts and row contacts may therefore be produced.

According to at least one embodiment, the radiation generated during operation in the semiconductor pillars leaves the latter only through the base region, and therefore in the direction away from the tips. In this case, a principal emission direction is oriented parallel to a longitudinal axis of the semiconductor pillars, extending from the respective base region to the tip. As an alternative, it is possible for the radiation to be emitted in the direction away from the base region, in particular only through the tip. Furthermore, the radiation generated can also be partially emitted at side surfaces of the semiconductor pillars.

According to at least one embodiment, the semiconductor pillars protrude from the casting body on one or two mutually opposite main sides of the casting body. That is to say, a thickness of the casting body may be less than a height of the semiconductor pillars. The semiconductor pillars are therefore located only partially in the casting body along the longitudinal axis. As an alternative, the casting body may be configured to be thicker so that the semiconductor pillars are fully located inside the casting body, as seen along the longitudinal axis, or that the semiconductor pillars protrude from the casting body only on a main side.

According to at least one embodiment, the first contact strips extend along rows at the tips of the semiconductor pillars. The tips of the semiconductor pillars may therefore be electrically contacted by means of the first contact strips. In this case, it is possible for the contact strips to be restricted to the region of the tips, and therefore extend at a distance from the base regions. The first contact strips may be oriented substantially perpendicularly to the longitudinal axes of the semiconductor pillars.

According to at least one embodiment, the second contact strips include a semiconductor layer, in particular an n-conductive semiconductor layer. In a non-limiting embodiment, the semiconductor pillars are grown from this semiconductor layer.

According to at least one embodiment, the semiconductor layer of the second contact strips is structured to form column contacts. This means that the semiconductor layer is then subdivided into a plurality of strips as seen in plan view. As an alternative, this semiconductor layer may be an uninterrupted and continuous layer. For example, this semiconductor layer has a thickness of at least 10 nm or 0.1 µm or 0.2 µm and/or of at most 2 µm or 1 µm.

According to at least one embodiment, at least one mirror is applied on a side of the semiconductor layer facing away from the semiconductor pillars. The at least one mirror is adapted for reflection of the radiation generated during operation. The mirror may be located directly on the semiconductor layer or, arranged at a distance from the semiconductor layer. The mirror is a metal mirror or a totally reflecting metal combination mirror.

According to at least one embodiment, an electrical through-contact is applied on the at least one mirror or on at least one of the mirrors or on all the mirrors. The through-contacting extends in the direction away from the semiconductor pillars. Inter alia, it is therefore possible for all electrical contacts for connection of the semiconductor pillars to be applied on a single main side of the semiconductor display.

According to at least one embodiment, the semiconductor display includes one or more mask layers. The at least one, such as precisely one, mask layer includes a multiplicity of openings. The semiconductor pillars are each grown from the openings, so that there may be a one-to-one correspondence between the openings and the semiconductor pillars. In this case, the fully grown semiconductor pillars have a larger diameter than the openings, so that the openings may respectively be fully covered by the semiconductor pillars, as seen in plan view.

According to at least one embodiment, the mask layer is made of an inorganic material such as a nitride, in particular silicon nitride, or an oxide such as silicon dioxide. The mask layer is a continuous layer, so that all the openings are formed in a single layer. The mask layer is in particular a thin layer, for example with a thickness of at most 200 nm or 50 nm or 10 nm or 3 nm. In particular, the thickness of the mask layer next to the openings is at least 0.1 nm or 1 nm or 5 nm or 20 nm.

According to at least one embodiment, the second contact strips include at least one transparent conductive layer. This conductive layer is located on the base regions or on the in particular n-conductive semiconductor layer of the second contact strips. The transparent conductive layer may, while being structured to form individual strips, extend along the columns and form column contacts.

According to at least one embodiment, the first contact strips are configured to be reflective for the radiation to be generated. In particular, the energization shells are in this case contained by the first contact strips. In this case, the energization shells are formed from a reflective metal such as silver. The energization shells may be both part of the semiconductor pillars and part of the first contact strips.

According to at least one embodiment, the second contact strips additionally include at least one busbar, for instance a metal busbar. In this case, the semiconductor pillars are located along a principal emission direction, each between the electrically assigned transparent conductive layer and the assigned busbar. That is to say, the second contact strips may extend along the principal emission direction on both sides of the semiconductor pillars.

According to at least one embodiment, the busbars are freely accessible. That is to say, the semiconductor display may, for example, be electrically contacted externally by means of the busbars. As an alternative, the busbars are buried inside the semiconductor display in order to avoid electrical short circuits.

According to at least one embodiment, the semiconductor pillars in the finished semiconductor display are still located on the growth substrate. As an alternative, the growth substrate has been removed from the semiconductor pillars so that the finished semiconductor display is free of the growth substrate.

According to at least one embodiment, the first and second contact strips are applied on the same side of the growth substrate as the semiconductor pillars. In this case, substantial parts of the first and second contact strips may also be located on the same side of the semiconductor pillars, for example all parts extending along the columns and/or rows and all electrical contact pads.

According to at least one embodiment, the first and/or second contact strips include electrical contact pads for external electrical contacting of the semiconductor display. In a non-limiting embodiment, the contact pads are configured to be solderable or electrically conductively adhesively bondable.

According to at least one embodiment, the contact pads are located next to an emission field of the semiconductor display as seen in plan view. The semiconductor pillars are arranged, in particular densely arranged, in the emission field. A compact arrangement of the semiconductor pillars may therefore be provided, which is not interrupted by any contact pads. As an alternative, it is possible for at least some of the contact pads, as seen in plan view, to be arranged congruently with the semiconductor pillars and/or the emission field and, for example, be located on a lower side, not intended for light emission, of the semiconductor display.

According to at least one embodiment, the semiconductor display is surface-mountable. In this case, all the contact pads are located on the same side of the semiconductor pillars.

According to at least one embodiment, the electrical contact pads have a greater width than the respectively associated first and/or second contact strips as seen in plan view. In other words, the contact pads are expanded in terms of width in relation to the associated contact strips. Such an arrangement of the contact pads is also referred to as fan-out.

According to at least one embodiment, angle-dependent emission is at least partially carried out by means of the semiconductor pillars. In this way, solid angle-dependent viewing channels are made possible, for instance for autostereoscopic, three-dimensional representations of images or films.

The angle-dependent emission may, for example, be achieved by a height variation of a cover layer or of electrical contacting of the semiconductor pillars. The angle dependency of the emission may also be achieved by a periodic arrangement of the recesses in which the semiconductor pillars are located.

Furthermore, the angle dependency of the emission may for example be achieved by the arrangement of luminescent materials. For example, the luminescent material is arranged in various recesses either in the vicinity of an emission surface or on the side surfaces of the semiconductor pillars, or there are different filling levels of the luminescent materials in relation to the longitudinal axis of the semiconductor pillars.

Furthermore, the angle dependency may be achieved by partial covering of the semiconductor pillars with an optically opaque, in particular metallic layer such as the energization shells, so that there is a variation in the arrangement of the energization shells along the longitudinal axes of the semiconductor pillars. In this way, furthermore, it is possible to achieve a variation in an energization, in particular a partial energization, by partial energization shells which, in particular, are arranged only on fractional areas of the lateral surfaces of the semiconductor pillars.

As an alternative or in addition, deactivation of subregions of the semiconductor pillars may be achieved, for instance by partially etching back or polishing the semiconductor pillars. In addition, the semiconductor pillars may be arranged with their bottom surfaces or base regions at different levels, for instance relative to the carrier, as a result of the transfer method.

According to at least one embodiment, there is an arrangement with solder ball contacting, also referred to as a ball grid array, under the display and/or the semiconductor component, so that the semiconducts, display and/or the semiconductor component may be mounted directly on an IC, for example by means of soldering.

According to at least one embodiment, optics are applied together over a plurality of semiconductor pillars. The radiation of a plurality of semiconductor pillars may therefore, for instance, be combined to form an image point or a color region for an image point. As an alternative, separate optics are respectively provided for individual semiconductor pillars. For example, spherical drops are produced around the semiconductor pillars.

According to at least one embodiment, the semiconductor pillars are arranged not upright and/or perpendicularly to a carrier or the main sides of the casting body, but recumbent. Longitudinal axes of the semiconductor pillars may therefore be oriented transversely, in particular parallel, to main extent directions of the semiconductor display. Emission by the semiconductor pillars then takes place primarily through their side surfaces and not, or only secondarily, through the tips. The longitudinal axes of the semiconductor pillars and the emission direction form an angle of 0° inclusive to less than 90°, in particular at most 45° or 30° or 15° and/or at least 5° or 15°.

An optoelectronic semiconductor component is furthermore provided. The semiconductor component is, in particular, adapted for a display such as described in connection with one or more of the embodiments mentioned above. Features of the semiconductor component are therefore also disclosed for the display, and vice versa.

In at least one embodiment, the semiconductor component includes one or more semiconductor pillars as well as a casting body. The casting body is molded with a form-fit onto the at least one semiconductor pillar. The semiconductor component is separately handleable. Furthermore, the semiconductor component includes electrical contact pads for energization of the associated semiconductor pillar or the associated semiconductor pillars.

A production method is furthermore provided for a display and/or a semiconductor component as explained in connection with one or more of the embodiments mentioned above. Features of the production method are therefore also disclosed for the display and the semiconductor component, and vice versa.

In at least one embodiment, the method includes the following steps, such as in the order indicated:

A) growing the multiplicity of semiconductor pillars on a growth substrate from the openings of the mask layer, B) applying the energization shells on the semiconductor pillars, C) producing the first and second electrical contact strips, and D) separation to form the display and/or to form the semiconductor components.

With the method described here, it is possible to grow the individual semiconductor pillars and/or regions for image points, i.e. pixels, densely arranged on the growth substrate and cost-efficiently. In this case, the semiconductor pillars may be transferred onto a carrier in an expanded fashion, i.e. at greater distances from one another than on the growth substrate.

According to at least one embodiment, the method includes a step E), which is carried out between steps A) and C). In particular, step E) is carried out between steps A) and B).

According to at least one embodiment, a carrier is provided in step E). Only some of the semiconductor pillars originally grown on the growth substrate are transferred onto the carrier. There is therefore an average distance of the semiconductor pillars on the carrier with larger values than on the growth substrate. For example, the average distance on the carrier is greater at least by a factor of 2 or 5 or 10 or 50 than on the growth substrate.

According to at least one embodiment, the semiconductor pillars are introduced into a transfer matrix in step E). The transfer matrix is for example made of a plastic such as a polymer, in particular a thermally or photochemically curable polymer or a thermoplastic polymer.

According to at least one embodiment, the transfer matrix is solidified around some of the semiconductor pillars. Only the semiconductor pillars with the solidified transfer matrix are detached from the growth substrate and therefore transferred onto the carrier. As an alternative, some of the semiconductor pillars are pressed into a solid transfer matrix, these semiconductor pillars then being deliberately removed from the growth substrate.

The semiconductor pillars remaining on the growth substrate may be transferred in a subsequent transfer step onto a different carrier, this step of sequential transfer of the semiconductor pillars being continued until all the semiconductor pillars are removed from the growth substrate. An average distance of the semiconductor pillars from one another on the carrier is a multiple of the average distance of the semiconductor pillars on the growth substrate.

According to at least one embodiment, the transfer matrix is removed after the transfer of the semiconductor pillars onto the carrier. That is to say, the transfer matrix is then not a constituent of the finished semiconductor display and/or of the finished semiconductor components.

According to at least one embodiment, the semiconductor pillars are grown directly on the mask layer with a smaller diameter than further away from the mask layer and the growth substrate. In this way, an intended fracture position for detachment of the semiconductor pillars from the growth substrate may be formed on the mask layer.

According to at least one embodiment, compaction or compression of the structures in order to increase the luminance is carried out by the transfer from the growth substrate, as an alternative or in addition to expansion in regions. The surface density of the semiconductor pillars may therefore, for example, be increased at least by a factor of 1.5 or 2 after the transfer, compared with the surface density on the growth substrate.

In this case, in particular, a plurality of semiconductor pillars arranged close together may be used in a group and function together as a pixel or image point or color region of an image point. Thus, by the use of the transfer methods described here, the distance between neighboring semiconductor pillars in the finished semiconductor display and/or in the finished semiconductor components may lie below the achievable distance which is achievable by the growth process and/or the contact process per se. The groups of semiconductor pillars compacted in this way may then be arranged at larger distances from one another.

Furthermore, large-surface or surface-wide compaction of the semiconductor pillars is possible, which may then be electrically connected collectively. It is furthermore possible to use the compacted structures in order to produce singularized individual elements, in particular LED chips, or individual groups with a high radiation density. Compacted structures may have a common electrical and/or mechanical contact and/or a common mirror.

According to at least one embodiment, regions without semiconductor pillars are already provided on the growth substrate. These regions may be spatially separated from the semiconductor pillars. Such regions may, for example, be subsequently used for electrical contacting. This subdivision into free regions and regions occupied by the semiconductor pillars and/or groups of semiconductor pillars may be transferred in a one-to-one fashion from the growth substrate, for instance onto a carrier.

BRIEF DESCRIPTION OF THE DRAWINGS

A semiconductor display as described here, an optoelectronic semiconductor component as described here and a method as described here will be explained in more detail below with reference to the drawing with the aid of exemplary embodiments. References which are the same in this case indicate elements which are the same in the individual figures. The referencing is not true to scale, however, but instead individual elements may be represented exaggeratedly large for better understanding.

DETAILED DESCRIPTION

Figure 1:
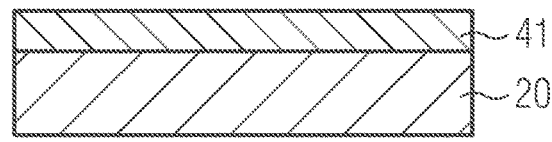
FIGS. 1 to 5 and 7 show schematic illustrations in sectional representations, perspective representations and plan views of method steps of methods described here for the production of exemplary embodiments of semiconductor displays and optoelectronic semiconductor components described here.
Figure 1:
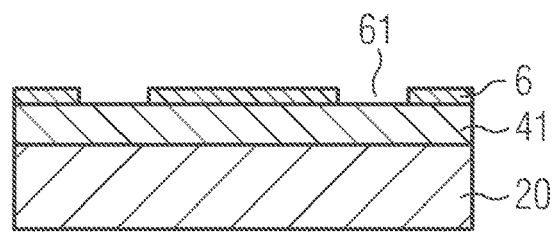
Figure 1:
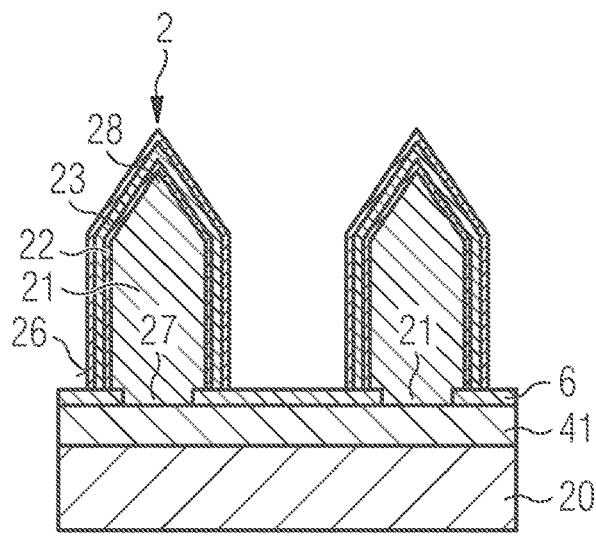
Figure 1:
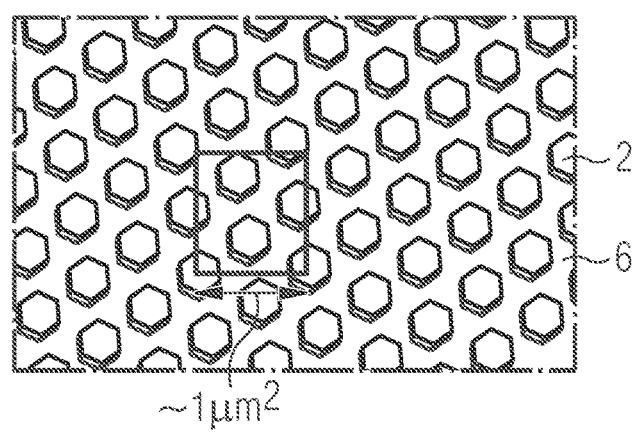
Figure 1:
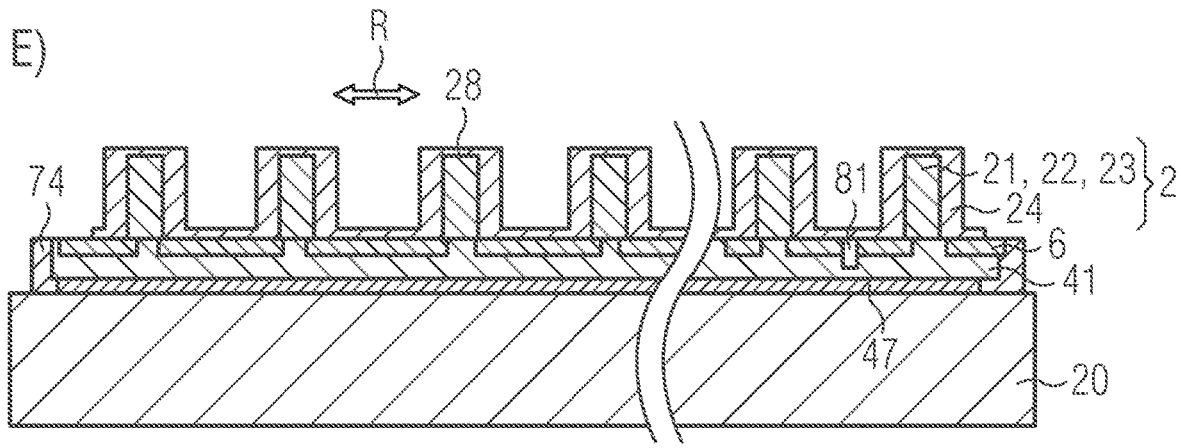
Figure 1:
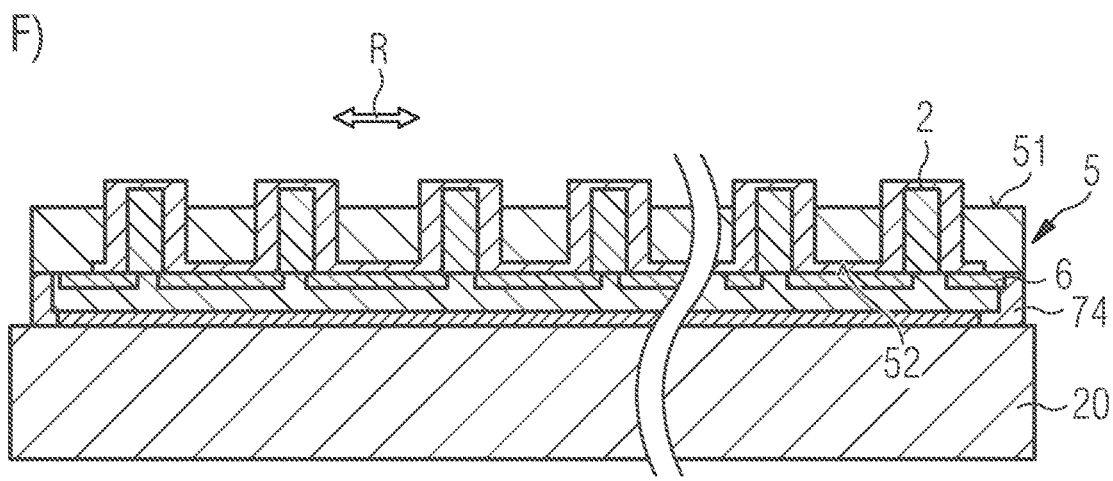
Figure 1:
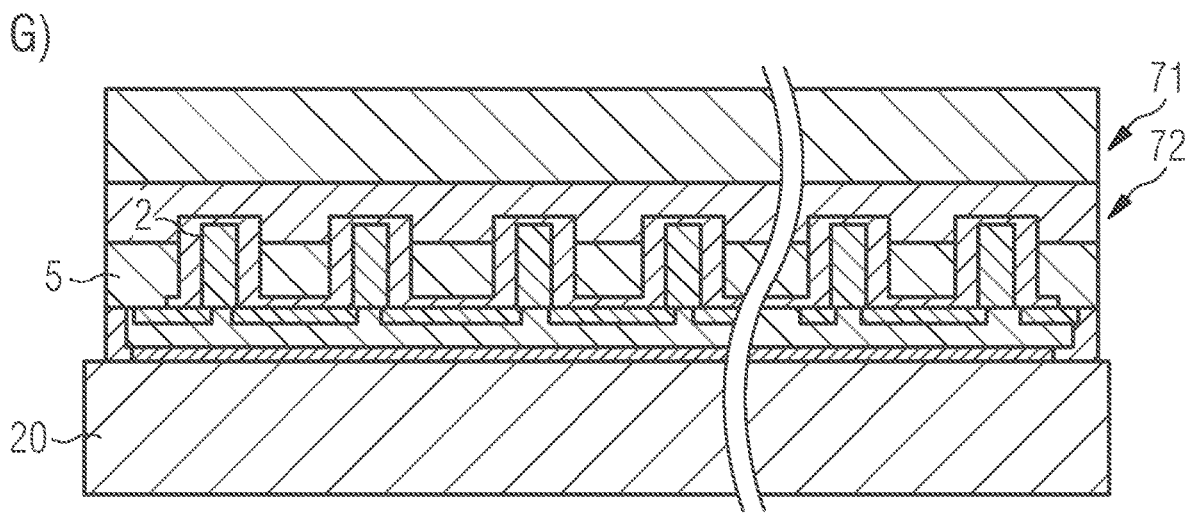
Figure 1:
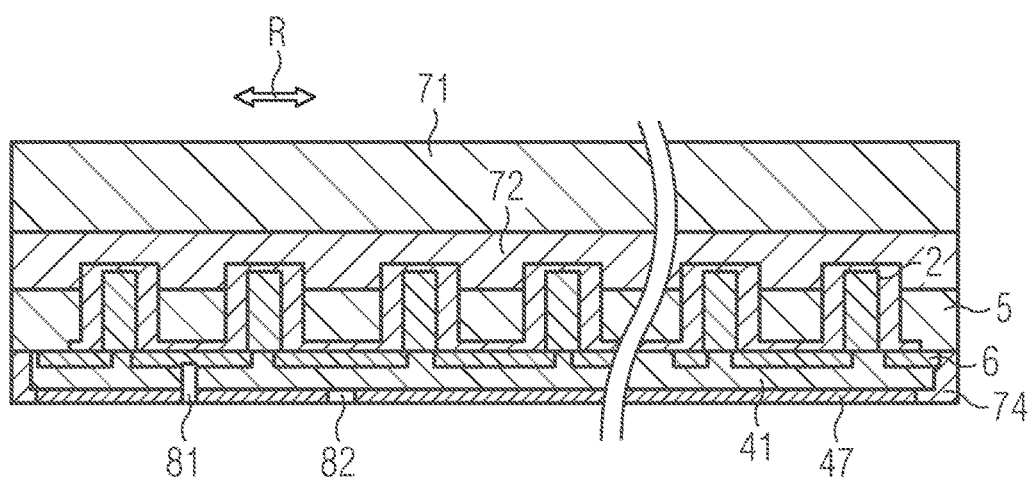
Figure 1:
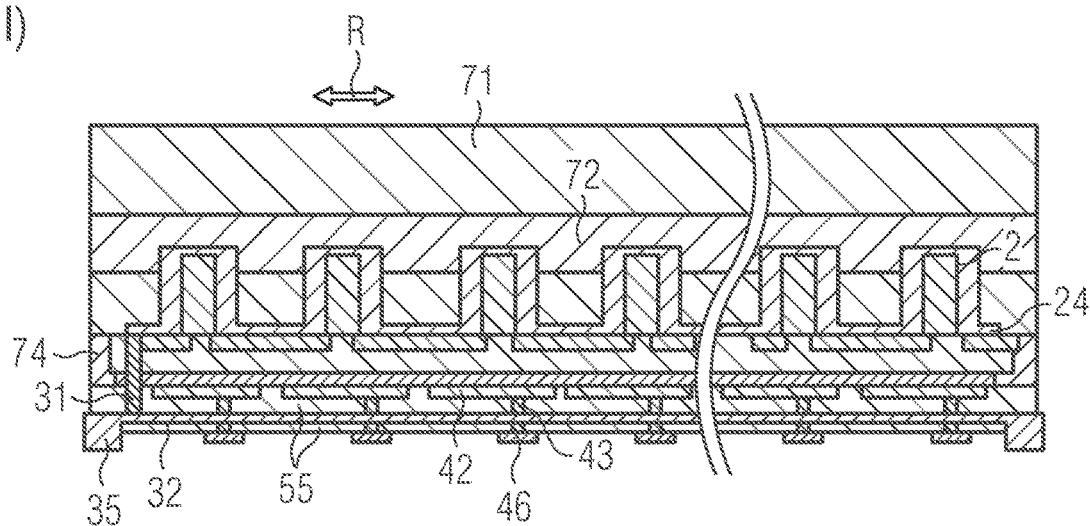
Figure 1:
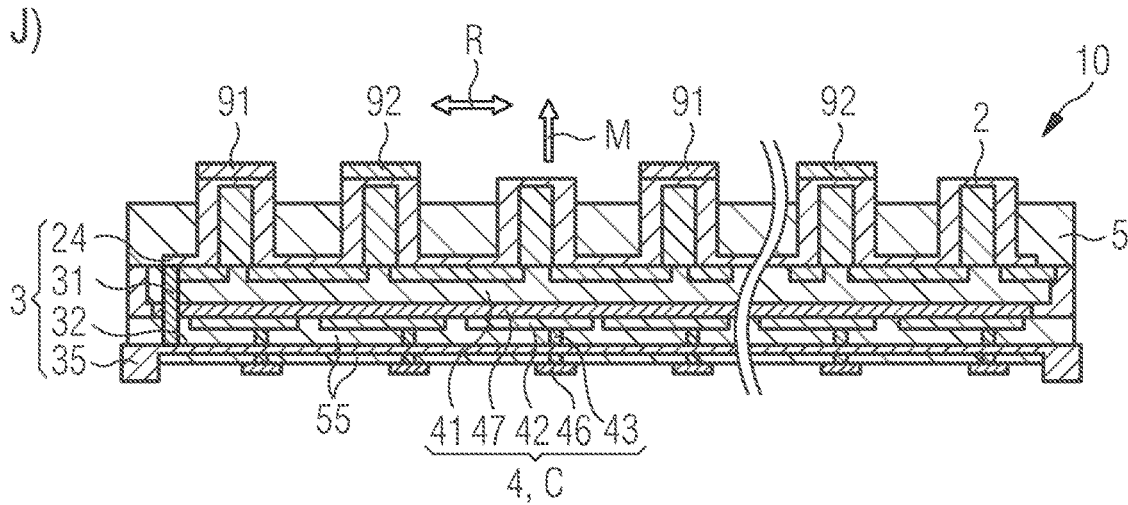
Figure 1:
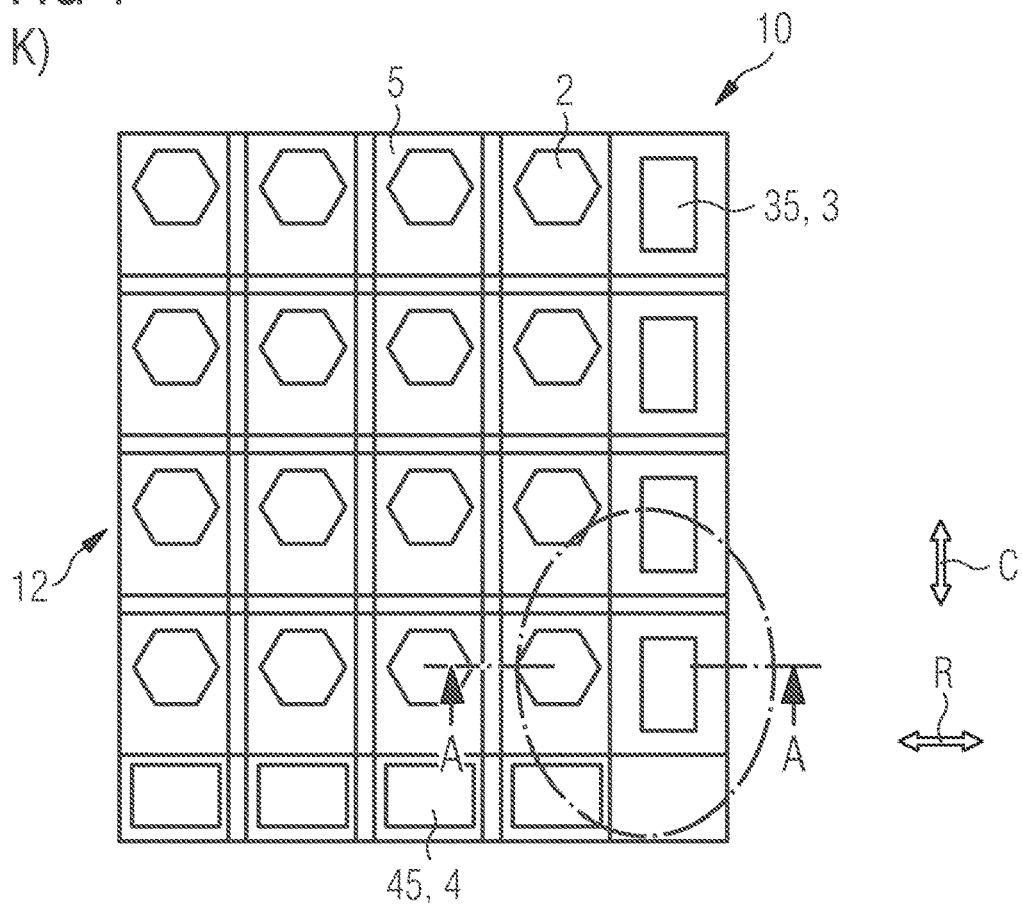
Figure 1:
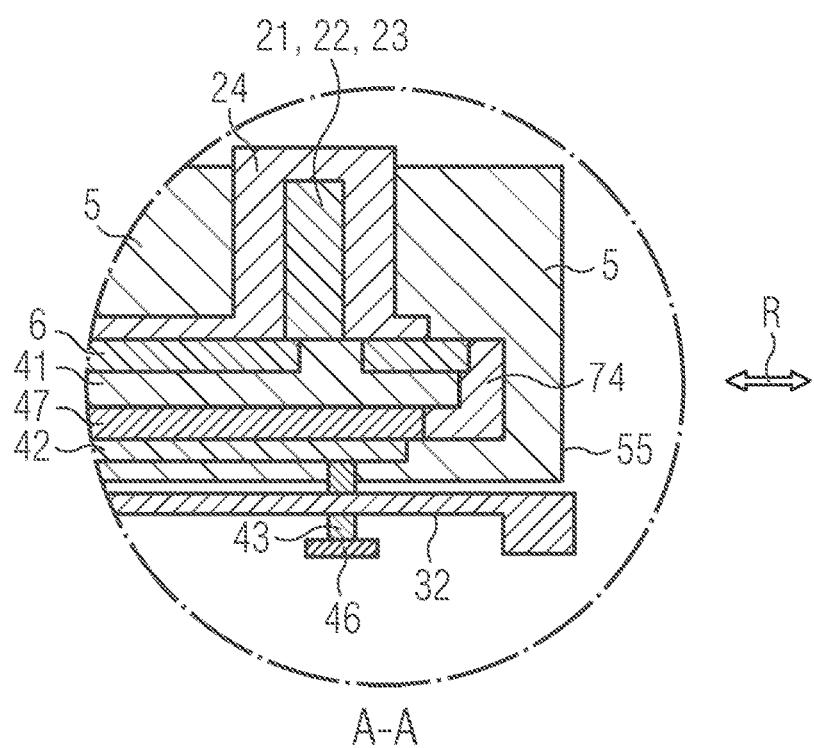
Figure 1:
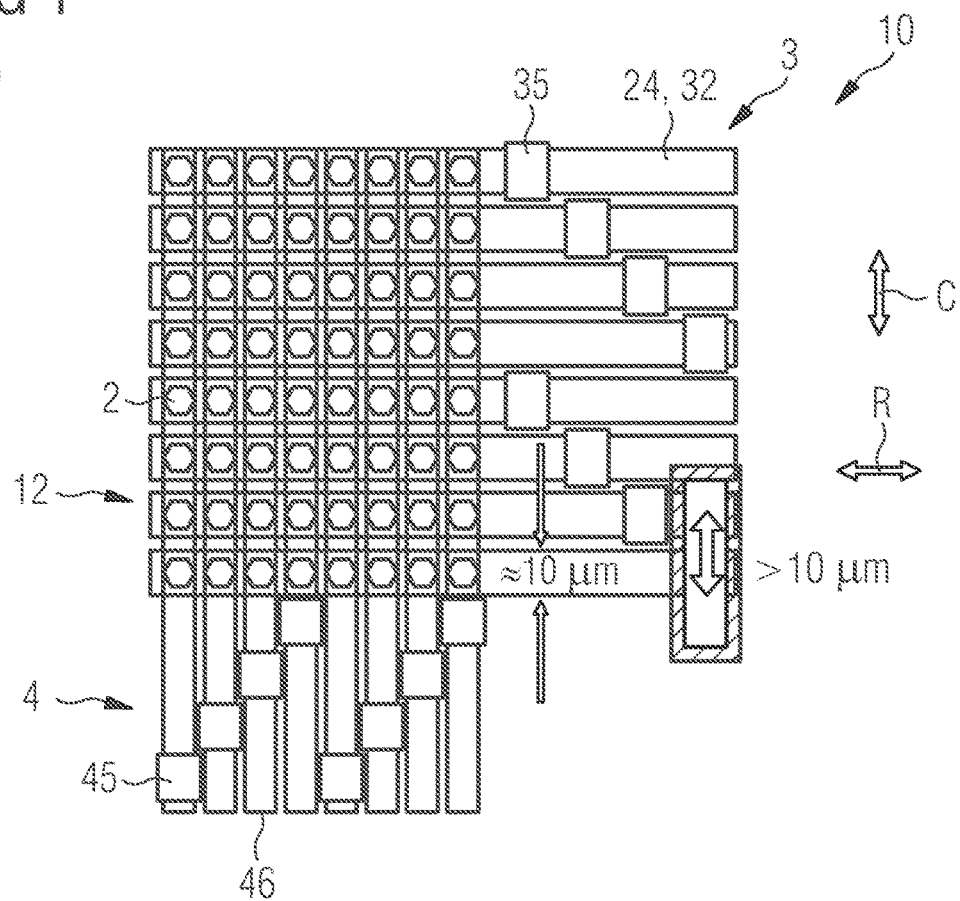
Figure 1:
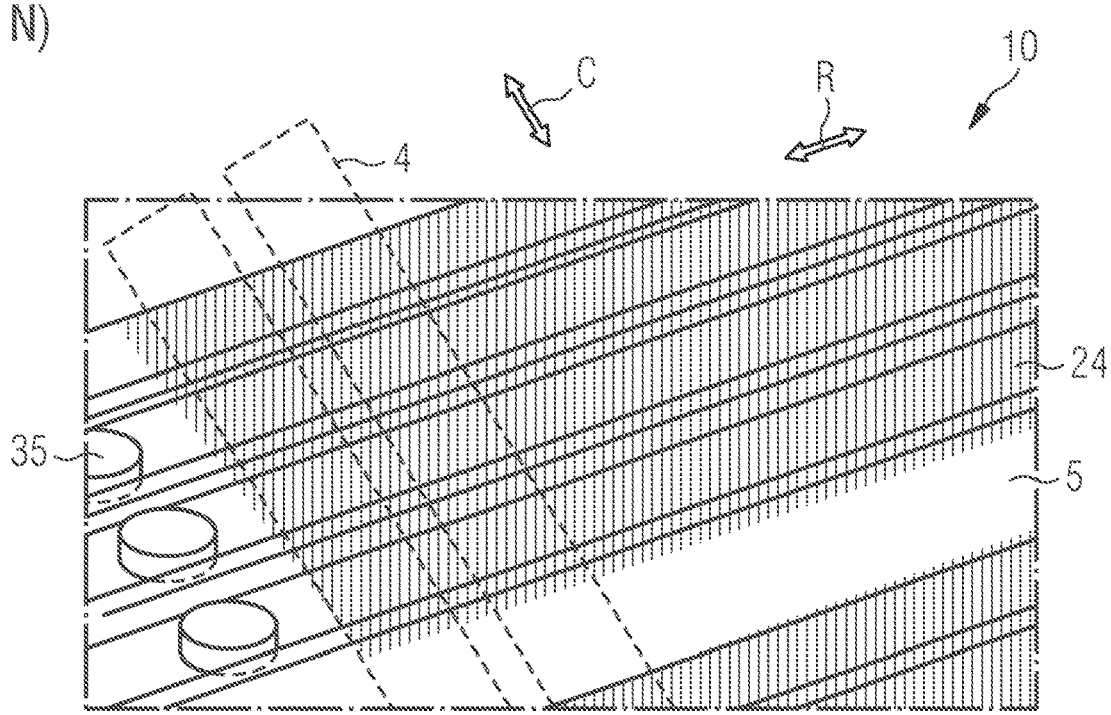
Figure 1:
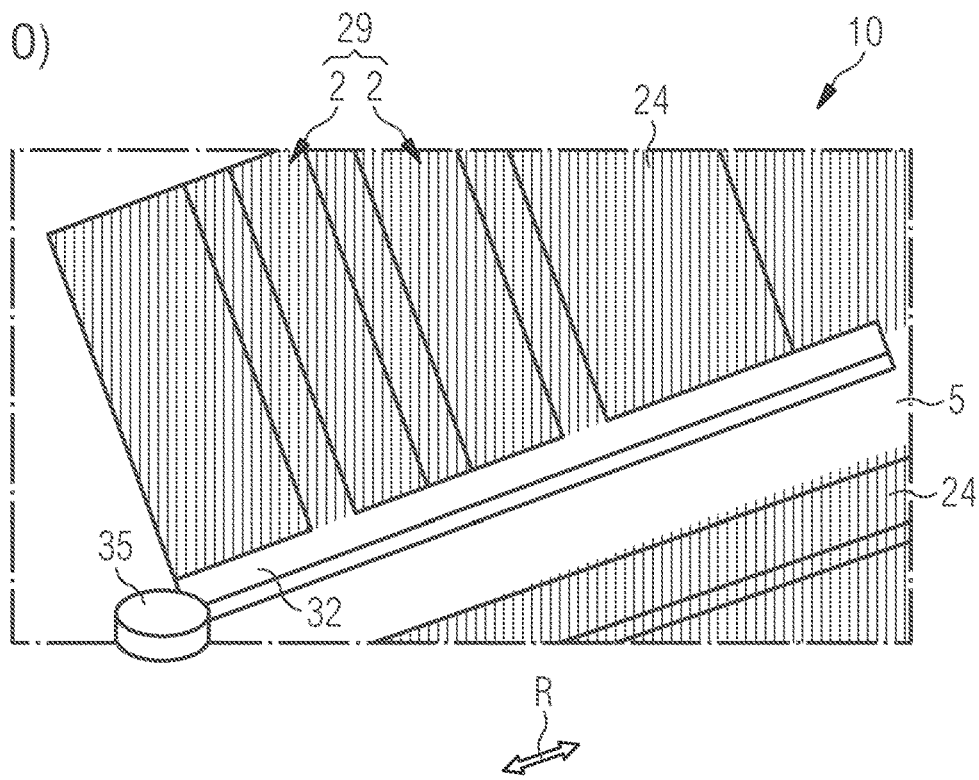

FIG. 1 describes a method for the production of semiconductor displays 1. According to the sectional representation in FIG. 1A, a growth substrate 20 is provided. The growth substrate 20 is, for example, a sapphire substrate or a silicon substrate. A n-conductive semiconductor layer 41 is grown over the surface of the growth substrate 20. The semiconductor layer 41 is, for instance, an n-conductive GaN layer.

In the method step of FIG. 1B, a mask layer 6 is first deposited continuously. Subsequently, a plurality of openings 61 are produced in the mask layer 6, for instance photolithographically. As an alternative, it is possible for the mask layer 6 with the openings 61 to be applied in a self-organizing fashion. For example, the mask layer 6 is an SiN layer or an $SiO_2$ layer.

In FIG. 1C, it is illustrated that semiconductor cores 21 are respectively grown starting from the openings 61. The semiconductor cores 21 are grown with a height which is similar to an average diameter of the semiconductor cores 21, which are hexagonal as seen in plan view, corresponding to an aspect ratio of close to 1, for instance between 0.8 and 2 inclusive. As an alternative, the semiconductor cores 21 and therefore the semiconductor pillars 2 may be significantly higher than wide, so that the aspect ratio lies for example between 5 and 10 inclusive. The semiconductor cores 21 are, for instance, made of n-doped GaN.

At least one active layer 22 is grown onto the semiconductor cores 21. The active layer 22, for example a single quantum well structure or a multiple quantum well structure, includes at least one quantum well layer, for instance of InGaN, and may moreover contain barrier layers.

A semiconductor shell 23, in particular of p-doped GaN, is respectively grown onto the active layer 22. This results in semiconductor pillars 2, starting from base regions 27 on the n-conductive semiconductor layer 41 and extending to the tips 28.

FIG. 1D shows a plan view. The semiconductor pillars 2 of FIG. 1C, which protrude from the mask layer 6, can be seen. The semiconductor pillars 2 are for example arranged in a hexagonal pattern, although in contrast to the representation in FIG. 1D they may also be arranged in a square or rectangular pattern. As seen in plan view, the semiconductor pillars 2 each have an area of less than 1 $\mu m^2$.

In the sectional representation in FIG. 1E, it is illustrated that an electrically conductive energization shell 24 is applied over the semiconductor shells 23 along a row direction R, continuously. The energization shell 24 is made of a transparent conductive oxide such as ITO or alternatively of a reflective metal such as silver, or of both. The energization shells 24 are molded directly onto the semiconductor material of the semiconductor pillars 2, and therefore three-dimensionally shaped.

It can furthermore be seen from FIG. 1E that there is optionally a buffer layer 47, for instance made of doped or undoped GaN, between the growth substrate 20 and the n-conductive layer 41. By means of the buffer layer 47, an electrical conductivity in combination with the n-conductive semiconductor layer 41 may be increased. As an alternative, the buffer layer 47 is made of a TCO or a metal or a semiconductor material, such as silicon.

At lateral edges of an emission field 12 with the semiconductor pillars 2 of the respective display 10, there may be edge protection 74. The edge protection 74 is for instance made of an oxide or nitride or plastic and covers side surfaces of the layers 41, 47 fully. In the direction away from the substrate 20, the edge protection 74 may end flush with the mask layer 6.

FIG. 1E furthermore schematically shows that the tips 28 may be flattened. The same may also apply in all other exemplary embodiments. In a non-limiting embodiment, however, the tips 28 are pyramidally shaped as illustrated in FIG. 1C.

Optionally, interruptions 81 may be created in the mask layer 6 and/or the n-doped semiconductor layer 41 and/or in the optional buffer layer 47. By means of these interruptions 81, columns C extending perpendicularly to the plane of the drawing may be electrically separated from one another.

FIG. 1F shows that a casting body 5 is produced from a plastic. The casting body 5 is for example made of an epoxide, for example with carbon black as a black filler, although may also have a different color. The casting body 5 is applied directly onto the mask layer 6 and the energization shells 24. A second main side 52 of the casting body 5 therefore bears in places directly on the mask layer 6 and the energization shells 24. A first main side 51, facing away from the growth substrate 20, of the casting body 5 is configured to be planar, and the semiconductor pillars 2 protrude therefrom.

According to FIG. 1G, a temporary connecting means 72 is applied, for example an adhesive. By means of the connecting means 72, which planarizes the semiconductor pillars 2, an auxiliary carrier 71 is applied.

Subsequently, see FIG. 1H, the growth substrate 20 is removed, for instance by means of a laser lift-off method, also abbreviated to LLO.

For electrical separation into the columns C perpendicularly to the plane of the drawing, interruptions 81, 82 of different depth may be manufactured between neighboring columns C. The exemplary interruption 81 extends as far as onto or into the mask layer 6. The exemplary interruption 82, on the other hand, is limited to the buffer layer 47 or may also extend into the n-conductive semiconductor layer 41, but not as far as the mask layer 6.

The sectional representation of FIG. 1I shows that a plurality of electrical connection components are created. Thus, a mirror 42, for example made of silver, is respectively applied below the semiconductor pillars 2 column-wise, i.e. in a direction perpendicular to the plane of the drawing. The mirrors 42 may be located directly on the optional buffer layer 47 or also directly on the n-conductive semiconductor layer 41.

For electrical insulation of the mirrors 42 from further conductive components, an insulating body 55 is produced, for example by means of injection molding or transfer molding or printing. Electrical through-contacts 31, 43 are fed through the insulating body 55. The through-contacts 31 of the first contact strips 3 connect the row-wise energization shells 24 to optional contact sections 32, made of a metal, along the rows R. As an alternative, the through-contacts 31 may extend directly to the contact pads 35 of the first contact strip 3.

Starting from the mirrors 42, the through-contacts 43 of the second contact strips 4 extend to busbars 46, made of a metal. The contact sections 32 are covered by the insulating body 55, as is optionally also possible for the busbars 46, unlike in the representation in FIG. 1I.

According to FIG. 1J, the auxiliary carrier 71 and the connecting means 72 are removed. First and second luminescent material layers 91, 92 may then optionally be applied onto some of the semiconductor pillars 2. With the first luminescent material layers 91, red light is for example generated, and with the second luminescent material layers 92, green light is for example generated. The semiconductor pillars 2 not covered by the luminescent material layers 91, 92 emit blue light. RGB image points can thus be produced with the luminescent material layers 91, 92. Such luminescent material layers 91, 92 may also be present in all other exemplary embodiments, and are adapted for the full conversion of blue light. If the semiconductor pillars 2 emit ultraviolet primary radiation, a further luminescent material (not shown) may be present in order to generate blue light. The luminescent materials 91, 92 need not necessarily be restricted to the semiconductor pillars 2, but may also extend onto the casting body 5.

The rewiring, as represented in FIG. 1J, is for example created by means of a mold support technology, abbreviated to MST. A region from the mask layer 6 as far as the contact pads 35, 45 has, for example, a thickness of a few tens of μm, for example of at least 20 μm or 40 μm and/or at most 200 μm or 50 μm, and contributes significantly to the mechanical stabilization of the semiconductor display 10. On the other hand, the casting body 5 with the semiconductor pillars 2 upward of the mask layer 6 has, for example, only a much smaller thickness of a few micrometers, for example at most 5 μm or 3 μm. Instead of the insulating body 55, mechanical stabilization of the semiconductor display 10 may also be achieved by thickening the contact pads 35, in particular by electroplating.

Also unlike the representation in FIG. 1J, it is possible for the casting body 5 to end flush with the semiconductor pillars 2 or flush with the luminescent material layers 91, 92, or even protrude beyond the semiconductor pillars 2 or luminescent material layers 91, 92, in the direction away from the mask layer 6. In this case the upper sides, facing away from the mask layer 6, of the semiconductor pillars 2 remain free of the casting body 5.

As an alternative or in addition to the luminescent material layers 91, 92, optics such as lenses may also be produced continuously or individually over the semiconductor pillars 2.

FIG. 1K shows a plan view, and FIG. 1L describes a sectional representation of a detailed view of FIG. 1K along the line A-A. It can be seen that the semiconductor pillars 2 are connected image point-wise and/or individually to the electrical contact pads 35, 45 by means of the contact sections 32 and busbars 46, so that the semiconductor pillars 2 can be electrically driven in a matrix fashion separately and along the columns C and rows R.

Because the mask layer 6 is still present in the finished component 10, encapsulation of the individual segments is inherently provided for the image points. Possibly exposed contacts may for example be protected by means of silicon dioxide, applied in particular by atomic layer deposition, abbreviated to ALD, or CVD. The in particular SMT-compatible contact pads 35, 45 of the fan-out structure may be reinforced by electroplating.

FIG. 1M schematically represents in a plan view that the contact pads 45, 35 are located outside the emission field 12 with the semiconductor pillars 2 in a so-called fan-out region. The individual contact pads 35, 45 are arranged offset from one another along the column direction C and the row direction R. In this way, it is possible for the contact pads 35 to be widened relative to the contact sections 32 and busbars 46. Thus, the contact sections 32 and the busbars 46 have widths of about 1 μm. On the other hand, as illustrated by way of example for one of the contact pads 35 of the first contact strips 3, widths and/or lengths of the contact pads 35 are at least 10 μm. This enlargement of the contact pads 35, 45 is made possible, in particular, by the offset arrangement.

In the embodiment of FIG. 1N, the contact pads 35 of the first contact strips 3 are located on the same side of the mask layer 6 as the semiconductor pillars 2. The second contact strips 4 extend on a lower side, in a similar way to FIG. 1J. The contact pads 35 on the upper side, as shown in FIG. 1N, may for example be contacted by means of bond wires.

In the exemplary embodiment of FIG. 1O, a plurality of the semiconductor pillars 2 are combined to form groups 29. The groups 29 are electrically connected to one another and coupled to a common contact pad 35, for example by the contact sections 32. Such a grouping of only a few semiconductor pillars 2 to form the groups 29 may also be carried out correspondingly in all other exemplary embodiments, independently of the precise contact scheme as far as the contact pads 35, 45. The grouping may be carried out on the first and/or on the second contact lines 3, 4.

The interconnection by means of the contact lines 3, 4 is in particular a cross-matrix connection, as also in all other exemplary embodiments.

As also in all other exemplary embodiments, the contact sections 32 may be optically transmissive and made of a transparent conductive oxide such as ITO. As an alternative, the contact sections 32 are metallic conductor tracks, which are applied partially or fully next to the semiconductor pillars 2, as seen in plan view. The same applies in respect of the busbars 46.

By the connection of a plurality of semiconductor pillars 2 together to form a group 29, increased tolerances are achieved in the described connection concept, and the semiconductor pillars 2 may furthermore be connected redundantly. The individual semiconductor pillars 2 are arranged spaced apart from one another in the finished semiconductor display 10, so that a distance of, for example, at least 2 μm or 5 μm remains available for metallic conductor tracks 32, 46 between the connections for the rows R and columns C.

The semiconductor displays 10 described here can be produced economically, for instance since a chip mounting technology is obviated. Furthermore, a long lifetime can be achieved also since components, in particular the semiconductor pillars 2, may be electrically interconnected redundantly. A large temperature range is available for applications, for example from −20° C. to 100° C., so that the semiconductor display 10 may be used in electronic parts liable to be heated, for example in direct sunlight. High image frame rates and a high contrast ratio can be achieved. The drive technology is compatible with conventional drive technologies. Furthermore, the semiconductor display 10 can be produced to be scalable in terms of size. By means of the fan-out contacting, i.e. the configuration of the contact pads 35, 45 outside the emission field 12, efficient fitting on control chips is possible.

The semiconductor displays 10 described here may, for example, be used in so-called industrial imaging, for instance in data displays, medical applications or simulation applications. Furthermore, use in so-called HUDs and HMDs is possible, for instance in the automotive sector, aeronautical sector or defense sector. The semiconductor displays 10 may be used as protection devices, for instance for interference patterns, metrology, three-dimensional sensors, 3D printers or prototype production, lithography or infrared projection.

Figure 2:
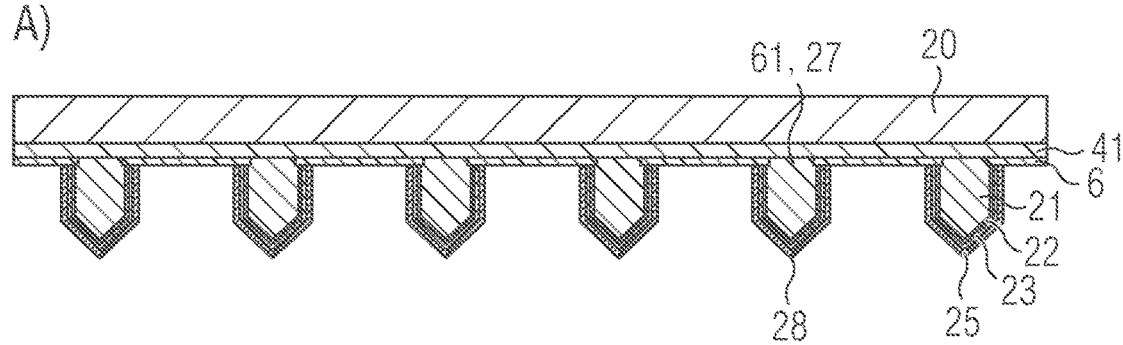
Figure 2:
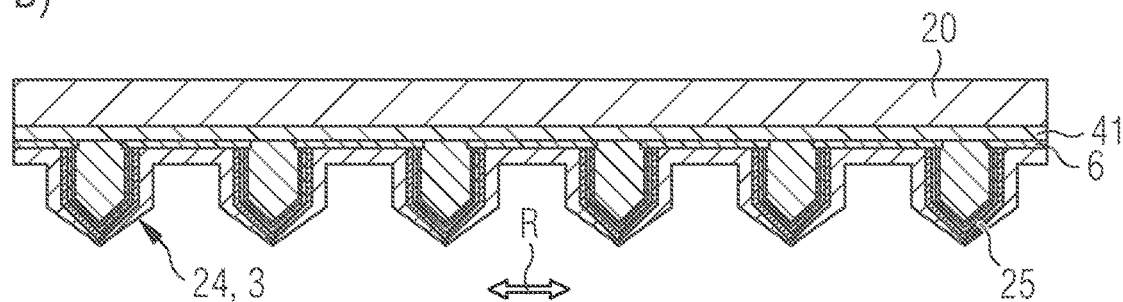
Figure 2:
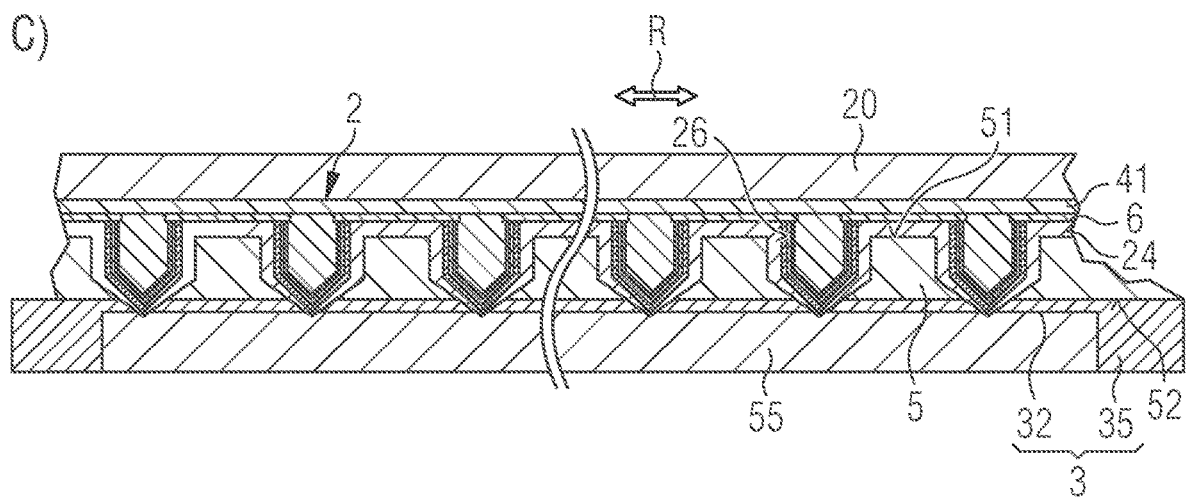
Figure 2:
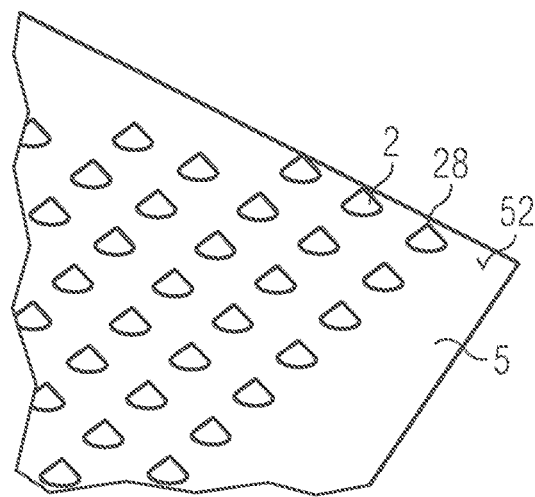
Figure 2:
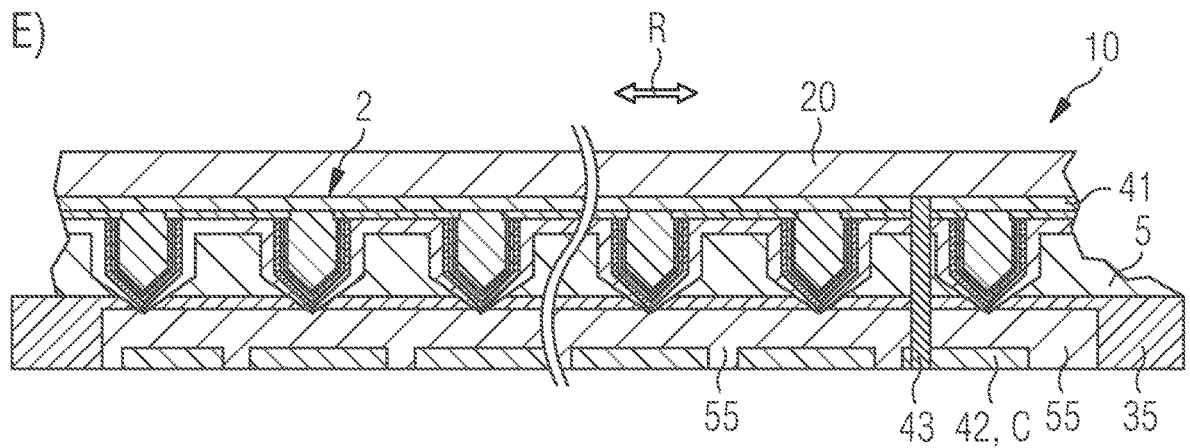
Figure 2:
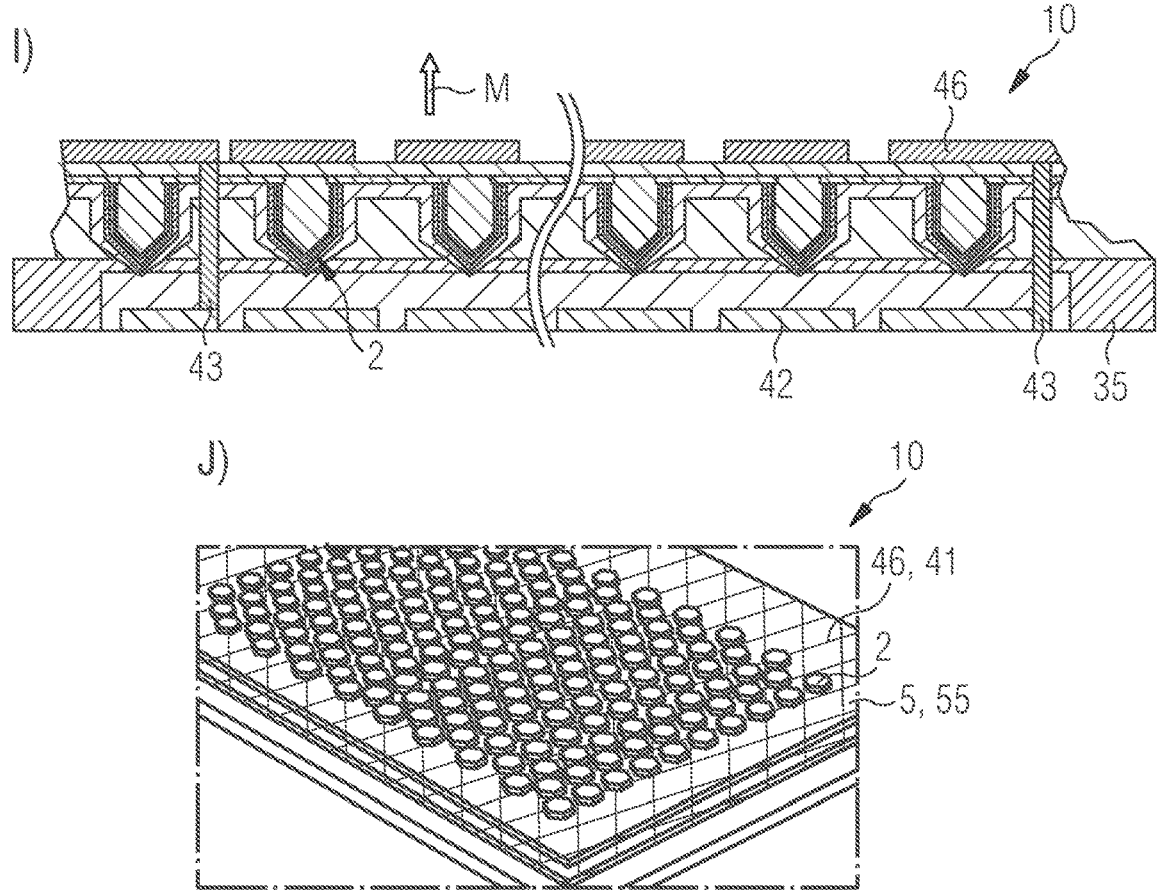

A finely pixelated LED display 10 or an LED projector chip may also be produced on the basis of the semiconductor pillars 2 with the methods of FIG. 2. In a similar way to FIGS. 1A to 1C, according to the sectional representation in FIG. 2A, a multiplicity of semiconductor pillars 2 are produced starting from the n-doped semiconductor layer 41 and the mask layer 6 applied thereon. In addition to the semiconductor cores 21, the active layers 22 and the semiconductor shells 23, additional layers 25 are optionally present, which are for example applied onto the semiconductor shells 23.

FIG. 2B shows that the energization shells 24 are applied directly onto the additional layers 25. The energization shells 24 are applied continuously along the rows R.

The sectional representation of FIG. 2C shows that the casting body 5, which is for example made of a black epoxide, is applied onto the energization shells 24 around the semiconductor pillars 2. In the direction away from the growth substrate 20, the casting body 5 is followed on the second main side 52 by the contact sections 32, which are structured in the manner of rows. The contact sections 32 are covered by the insulating body 55, from which the contact pads 35 protrude.

The second main side 52 before the production of the contact sections 32 is shown in a perspective plan view in FIG. 2D. The tips 28 of the semiconductor pillars 2 protrude from the casting body 5. The energization shells 24 can therefore be contacted at the tips 28 by means of the contact sections 32. In this case, the contact sections 32 are restricted to the region of the tips 28, so that the side surfaces 26 of the semiconductor pillars 2 may be free of the contact sections 32.

In contrast to the representation in FIG. 2D, it is possible for the semiconductor pillars 2 to protrude over different lengths from the casting body 5, so that for instance a periodic level variation may be achieved in particular by means of the casting body 5 and/or through different heights of the semiconductor pillars 2 and/or through a varying thickness of a filler layer (not shown). The semiconductor pillars 2 may thus be exposed with different emission heights. Angle-dependent emission may therefore be achieved. The same applies for all other exemplary embodiments.

According to the sectional representation in FIG. 2E, the through-contacts 43 for the second contact strips 4 are produced through the casting body 5 and the insulating body 55. By means of these through-contacts 43, the n-conductive semiconductor layer 41, which is for example continuous, is connected to the mirrors 42 for the column contacts C.

The through-contacts 31, 43 are in this case, see the plan view in FIG. 2F, located outside the emission field 12. Like the contact pads 35, the through-contacts 31, 43 may have a larger bottom surface outside the emission field 12, as seen in plan view, in particular a greater width, than the associated busbars 46 and contact sections 32. The busbars 46 may in this case be identical to the metal mirrors 42 configured as column contacts.

The sectional representation of FIG. 2G illustrates that a carrier 7 is optionally applied. By means of the carrier 7, the semiconductor display 10 is mechanically stabilized and can be handled in a mechanically self-supporting way. Such a carrier 7 may also be present in all other exemplary embodiments. The carrier 7 may contain electrical circuits and control elements for driving the semiconductor display 10.

FIG. 2H shows that the optically transmissive busbars 46 are applied onto the n-conductive semiconductor layer 41. The busbars 46 may fully cover the semiconductor pillars 2. In a non-limiting embodiment, the busbars 46 are made of a material which is transmissive for the radiation generated, such as ITO. Principal emission M therefore takes place through the busbars 46.

FIG. 2I illustrates that the through-contacts 43 for the second contact strips 4 may be placed differently.

In FIG. 2I, as well as in FIGS. 2G and 2H, only one or only two of the through-contacts 43 is or are shown. In a non-limiting embodiment, at least one such through-contact 43 is present for each of the columns C, such as precisely two through-contacts, at each start and at each end of the rows R and the columns C.

Likewise, the n-doped semiconductor layer 41 is respectively shown as continuous in FIGS. 2G, 2H and 2I. As an alternative thereto, in a similar way to FIG. 1H, it is possible for interruptions 81, 82 (not shown in FIG. 2) to be present, so that the n-conductive semiconductor layer 41 is then structured column-wise. The same applies for all other exemplary embodiments.

Such interruptions 81, 82, in a similar way to FIG. 1H, may for example be produced by means of plasma etching. As seen in plan view, these interruptions 81, 82 may, as also in all other exemplary embodiments, be configured hexagonally like the semiconductor pillars 2, or in contrast thereto as an alternative circularly, squarely or rectangularly.

FIG. 2J shows a perspective representation of the semiconductor display 10. From above, the individual semiconductor pillars 2 may be seen, which are embedded in the casting body 5 and in the insulating body 55. The semiconductor pillars 2 are covered by the optically transmissive n-conductive semiconductor layer 41 and by the optically transmissive busbars 46.

Unlike in connection with FIG. 1, in the method of FIG. 2 it is not necessary for the radiation-transmissive busbars 46 to match the semiconductor pillars 2, unlike the radiation-transmissive energization shells 24 of FIG. 1. The busbars 46 of FIG. 2 are shaped to be flat and planar. This means, in particular, that the individual semiconductor pillars 2 and therefore image points of the semiconductor display 10 may have a planar surface in the emission direction. The light is generated in the pyramidal and/or prismatic active layer 22, and according to FIG. 2 directed along the principal emission direction M by the reflective energization shell 24 functioning as a mirror, for instance made of silver.

In FIG. 2, TCO contacts in the manner of rows on the emission side therefore form the electrical terminals for the n-sides 27 of the semiconductor pillars 2. These TCO contacts 46 may, in contrast to the representation of FIG. 2, additionally be combined with metal tracks. Such metal tracks may partially cover the semiconductor pillars 2 as seen in plan view.

If a reflective material is not used and/or a material partially transmissive for the radiation generated is used for the energization shells 24, in all exemplary embodiments it is possible for the casting body 5 to be configured as a reflector and, for example, to be formed by matrix material such as a silicone with a reflective filler such as titanium dioxide particles. It is furthermore possible, as also in all other exemplary embodiments, for the energization shells 24 to be composed of a plurality of sublayers, for example of a layer of a transparent conductive oxide and one or more metal layers.

By an additional metal coating for the busbars 46, which extends over the semiconductor pillars 2, optical crosstalk between neighboring image points and semiconductor pillars 2 may also be prevented. A light exit aperture per semiconductor pillar 2 may therefore be reduced relative to a bottom surface of the semiconductor pillar 2. The same applies for all other exemplary embodiments.

Figure 3:
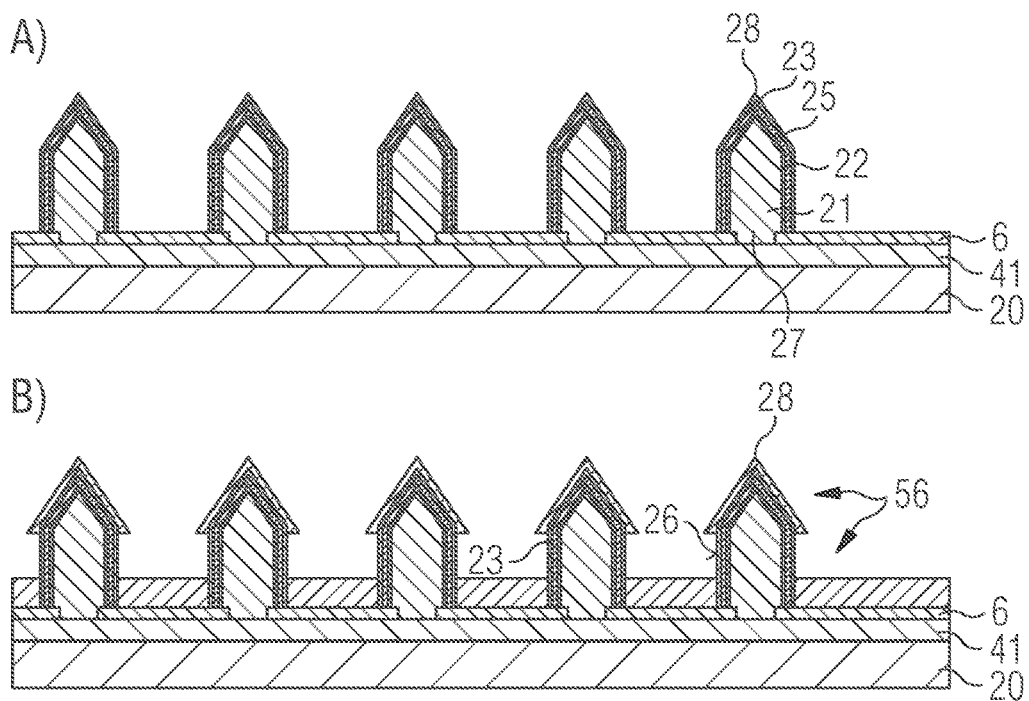
Figure 3:
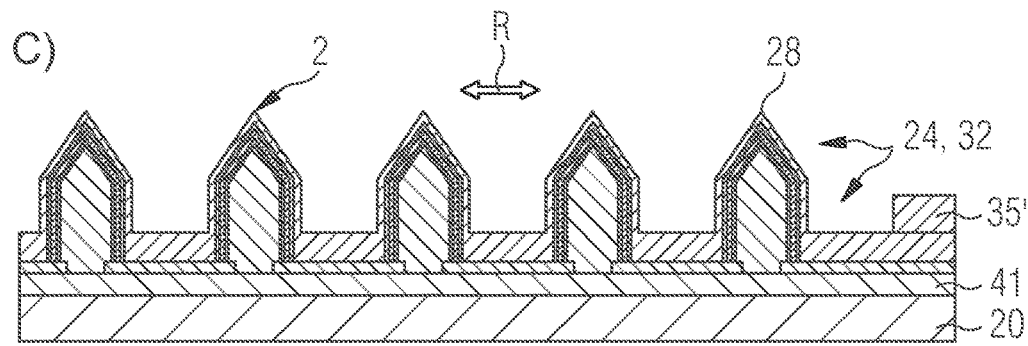
Figure 3:
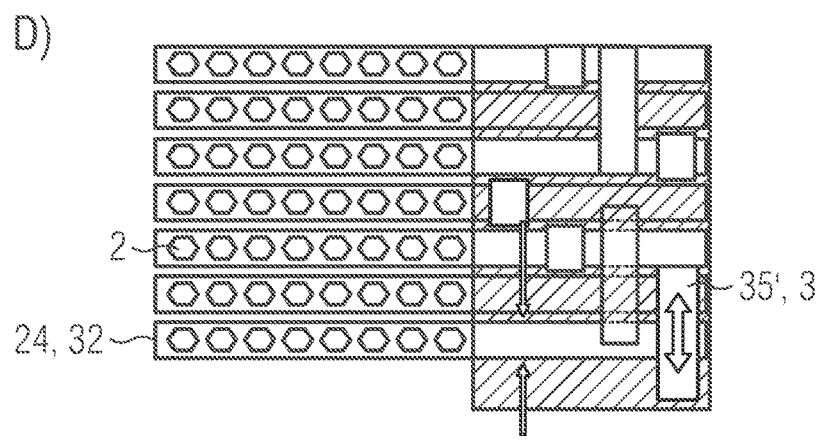
Figure 3:
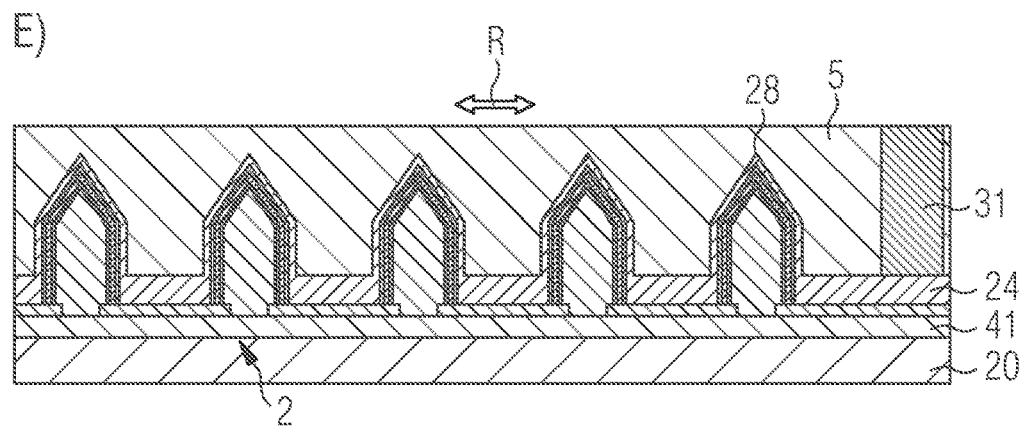
Figure 3:
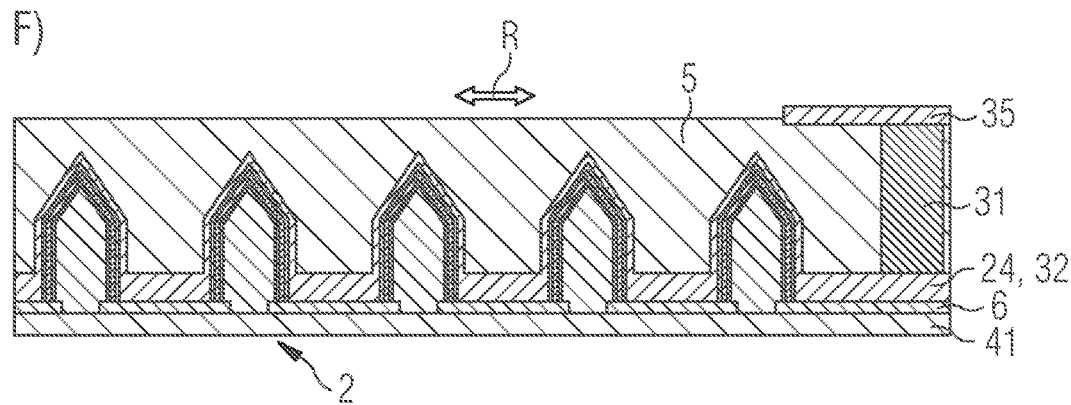
Figure 3:
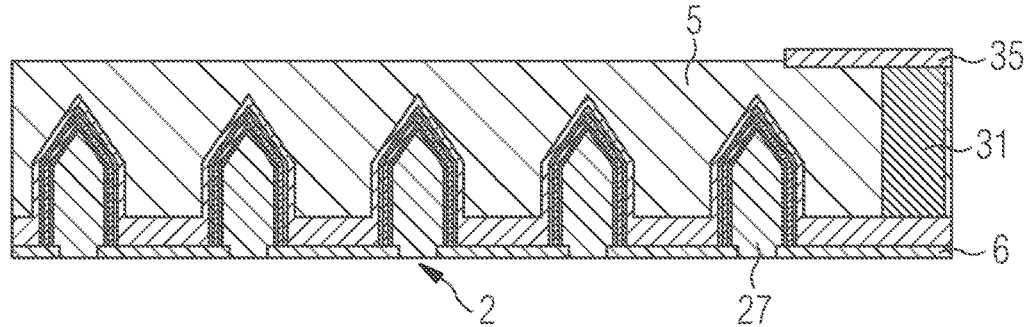
Figure 3:
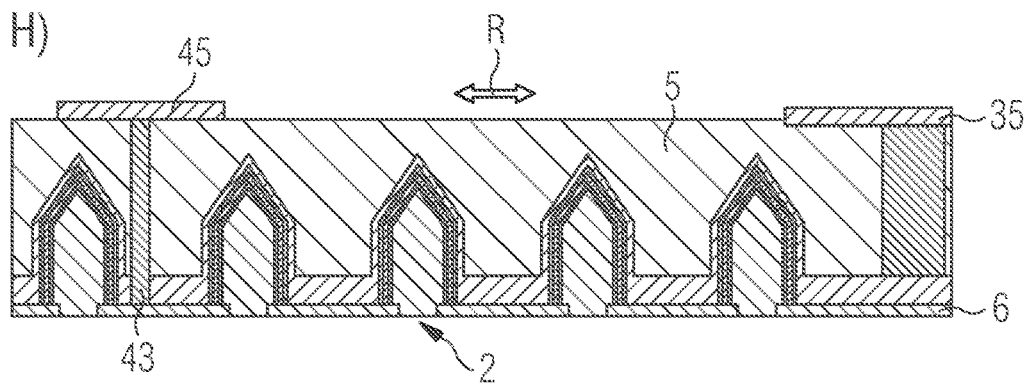
Figure 3:
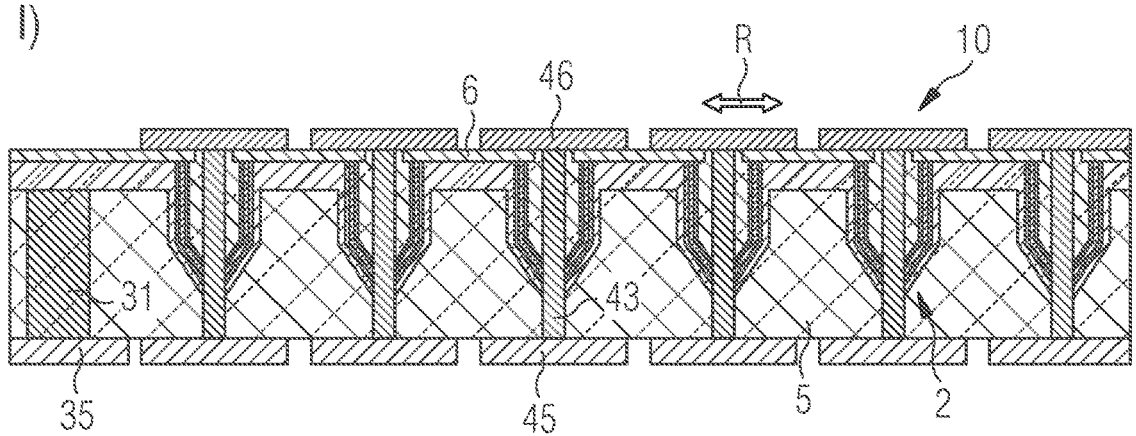
Figure 3:
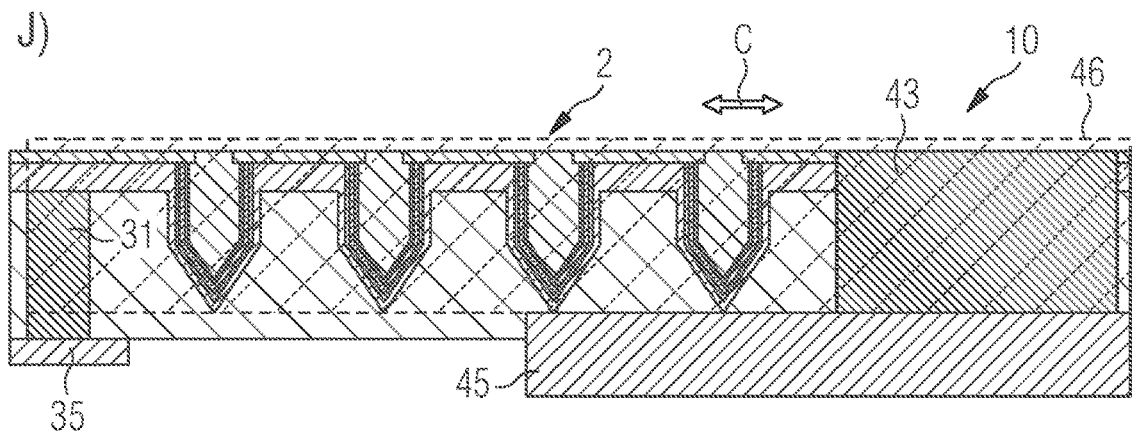
Figure 3:
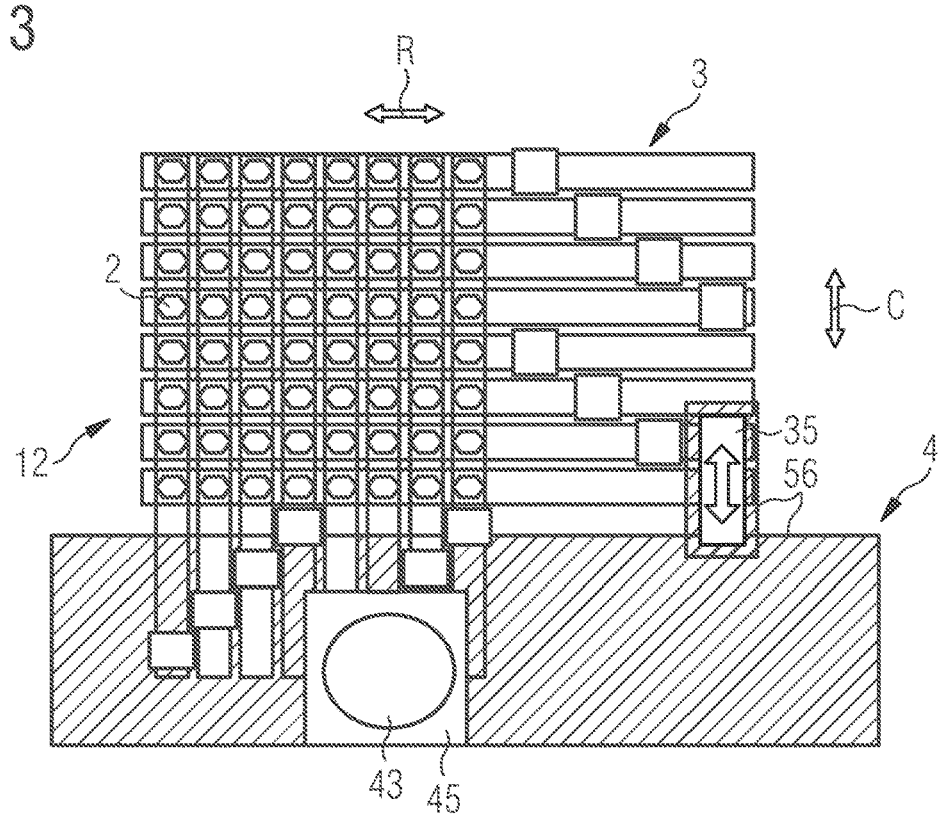
Figure 3:
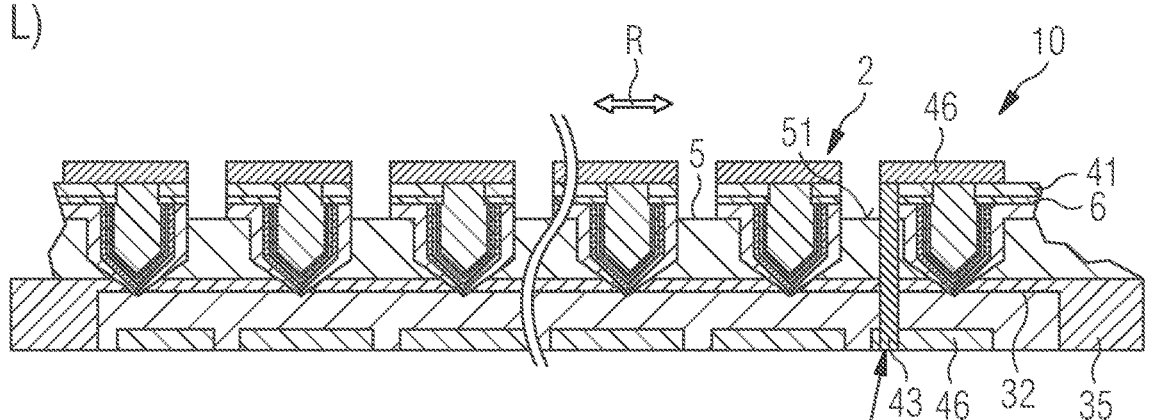
Figure 3:
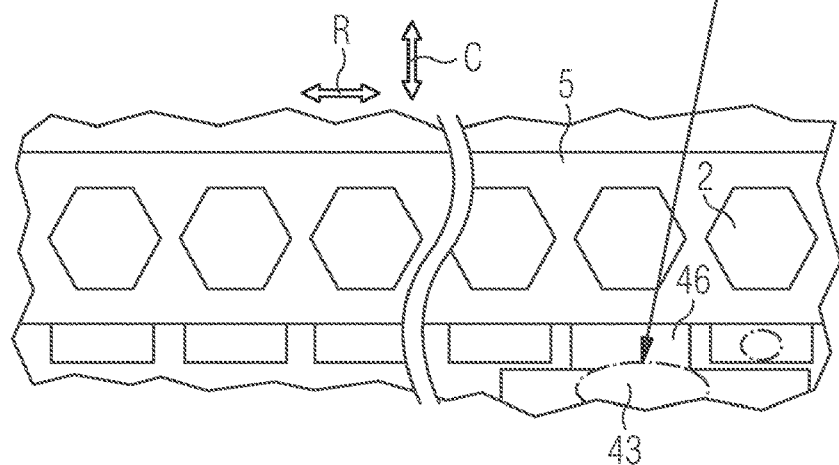
Figure 3:
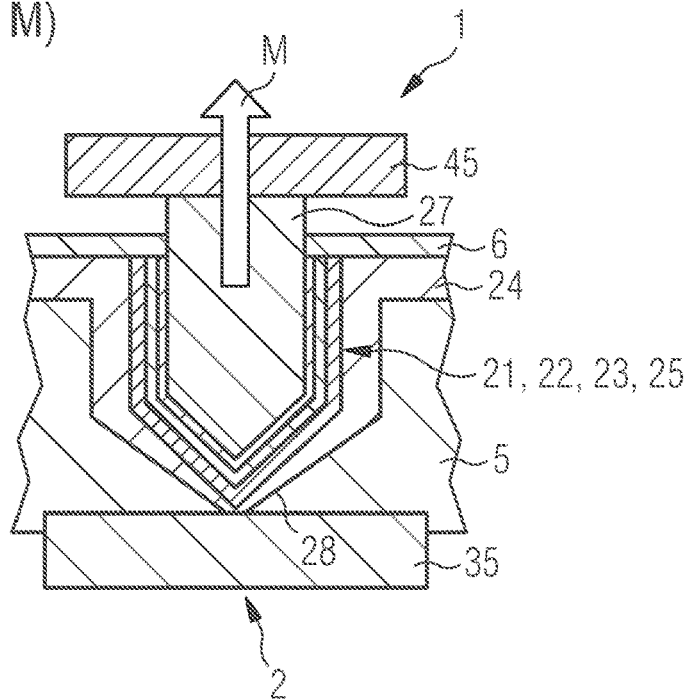
Figure 3:
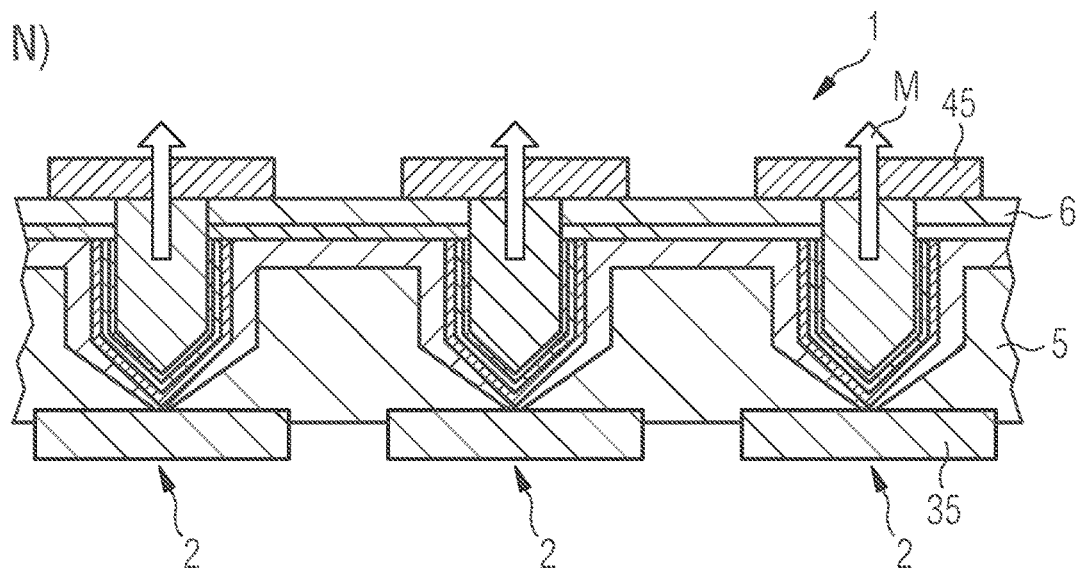
Figure 3:
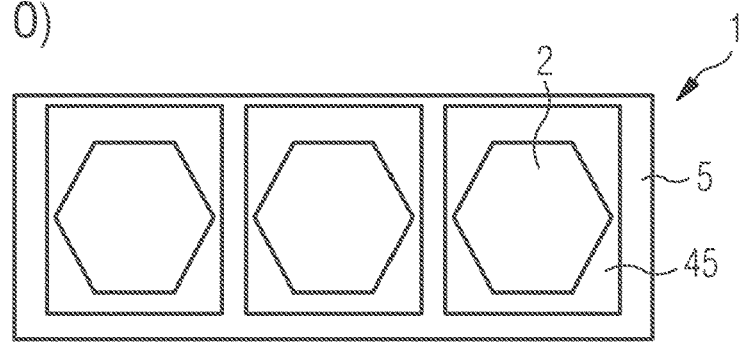
Figure 3:
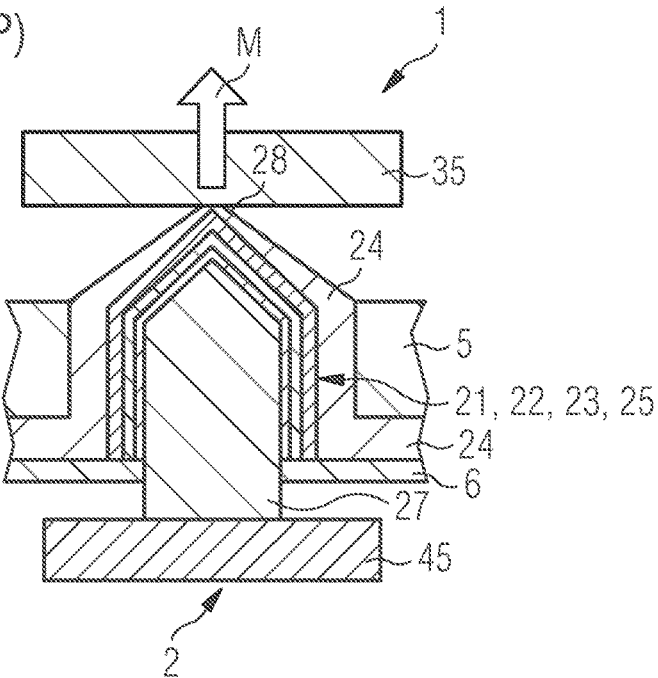
Figure 3:
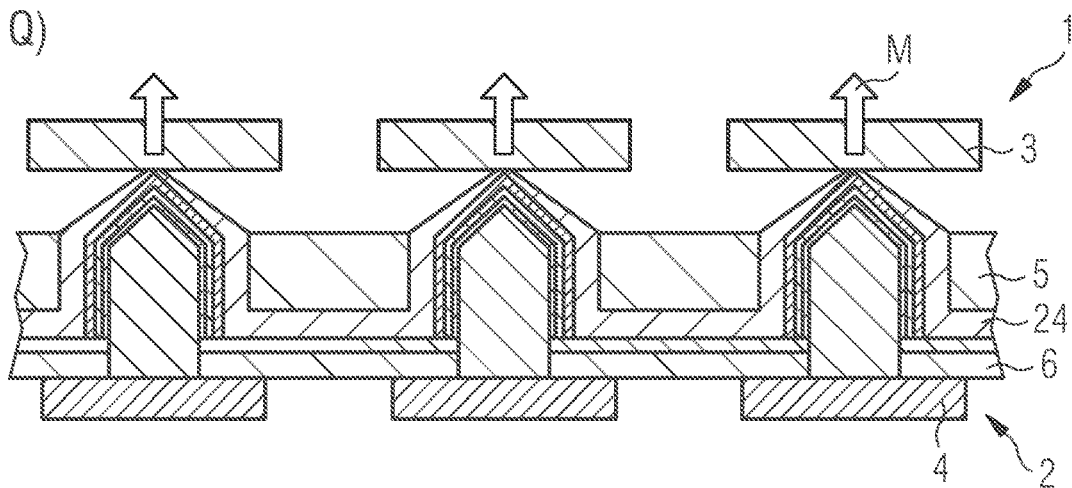
Figure 3:
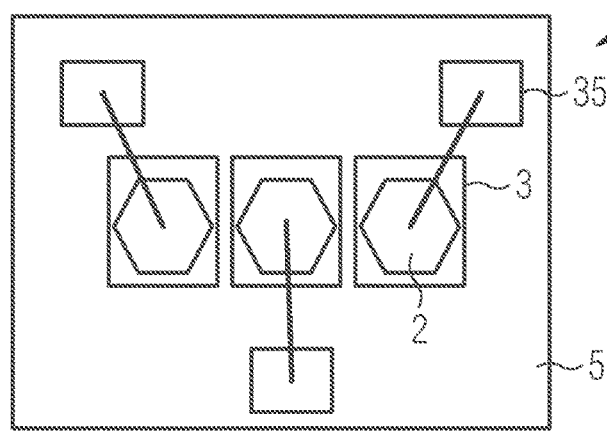
Figure 3:
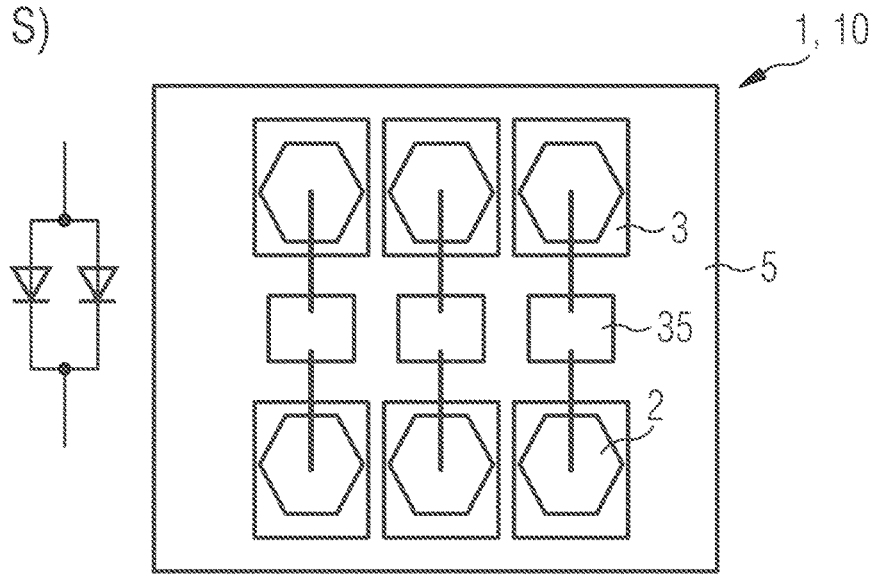

In the method of FIG. 3, see the sectional representation in FIG. 3A, the growth of the semiconductor materials of the semiconductor pillars 2 takes place in a similar way to FIG. 1 or 2. In contrast to FIG. 2, the additional layers 25 may also be applied directly on the active layers 22, so that the semiconductor shells 23 form the semiconductor material lying furthest outward of the semiconductor pillars 2.

In the optional method step of FIG. 3B, a passivation layer 56 is produced by means of a directional application method. The passivation layer 56 is for example made of an oxide such as silicon oxide or a nitride such as silicon nitride, although it may also be made of an organic material such as a photoresist. By means of such a passivation layer 56, it is possible for the energization shells 24 subsequently to be applied electrically conductively only in regions onto the semiconductor material of the semiconductor pillars 2.

During the application of the passivation layer 56, as shown in FIG. 3B, only the side surfaces 26 are electrically contactable. A region directly on the mask layer 26 and on the tips 28 is therefore electrically uncontactable and electrically protected. In this case, in particular, the additional layer 25 may be used for current spreading along the semiconductor pillars 2. The passivation layer 56 may still be partially or fully present in the finished displays 10 and semiconductor components 1, or it may also be removed.

According to the sectional representation in FIG. 3C, the energization shells 24 are applied, such as continuously along the rows R. The energization shells 24 are for instance formed from a metal layer such as silver, or from a combination of a silver layer and a transparent conductive oxide layer. The energization shells 24 are, for example, produced by evaporation deposition or sputtering. A region 35' for the subsequent contact pads 35 is provided at an edge. This is also schematically illustrated in the plan view of FIG. 3D.

In the step as explained in the sectional representation of FIG. 3E, the casting body 5 is produced, which extends over the tips 28 of the semiconductor pillars 2 and therefore fully covers the semiconductor pillars 2. Starting from the energization shells 24 and the region 35', the through-contacts 31 for the individual rows C are produced through the casting body 5, for example by electroplating.

Subsequently, see FIG. 3F, the contact pads 35 are produced, which may fully cover the through-contacts 31 and may extend partially beyond them onto the casting body 5.

In the optional method step of FIG. 3G, the n-conductive semiconductor layer 41 is partially or fully removed so that the base regions 27 and the mask layer 6 are exposed. The mask layer 6 is therefore preserved. The mask layer 6 may therefore be used as passivation for the semiconductor pillars 2.

The step of FIG. 3H shows that the through-contacts 43 for the column contacts C are created through the casting body 5 and the mask layer 6. The electrical contact pads 45 may furthermore be produced on the casting body 5. The contact pads 35, 45 are therefore all located on the same side of the casting body 5, so that the semiconductor display 10 may subsequently be surface-mountable.

In the step of FIG. 3I, the through-contacts 43 are provided with the busbars 46. The busbars 46 are radiation-transmissive and made of a transparent conductive oxide such as ITO. FIG. 3I furthermore illustrates that the through-contacts 43 may extend along the columns C, i.e. perpendicularly to the plane of the drawing of FIG. 3I, congruently to the semiconductor pillars 2, unlike the through-contacts 43 of FIG. 3H which are arranged offset.

In this case, as shown in FIG. 3J, the through-contacts 43 are located outside the emission field 12 with the semiconductor pillars 2. The contact pads 45 and/or the through-contacts 46 may therefore be configured to be larger, in order to achieve simpler electrical contacting of the semiconductor display 10. This is furthermore illustrated in the plan view of FIG. 3K.

A diameter of the through-contact 43 as seen in plan view is, for example, at least 10 µm and/or at most 200 µm, in particular about 50 µm. Through-contacts 31, 43 and/or contact pads 35, 45 of corresponding size may also be present in the fan-out region outside the emission field 12 in all other exemplary embodiments.

The sectional representation of FIG. 3L and the associated plan view, likewise in FIG. 3L, represent a semiconductor display 10 similar to that of FIG. 2H. Unlike FIG. 2H, however, the n-conductive semiconductor layer 41 is structured to form the columns C, so that the n-conductive semiconductor layer 41 extends in a plurality of bands in a direction perpendicular to the plane of the drawing. The through-contacts 43 for the respective columns C are again located outside the emission field 12 with the semiconductor pillars 2.

Like the n-conductive semiconductor layer 41, the mask layer 6 may be structured. The first main side 51 of the casting body 5 is therefore exposed in places. Optionally, these exposed regions of the casting body 5, and therefore possibly likewise exposed regions of the semiconductor pillars 2, may optionally be provided with a protective layer (not shown).

FIG. 3M shows an exemplary embodiment of an optoelectronic semiconductor component 1. The semiconductor component 1 according to FIG. 3M includes precisely one semiconductor pillar 2, which is embedded directly into the casting body 5. The p-contact pad 35 is located on the tip 28, and the n-contact pad 45 is applied on the base region 27. In this case, the n-contact pad 45 is configured to be transparent and the p-contact pad 35 is reflective, like the energization shell 24. Emission M therefore takes place only via the base region 27 and through the n-contact pad 45.

The semiconductor component 1 of FIG. 3M is produced, for example, by an individualization process such as sawing or laser cutting or fracture, starting from the arrangements such as represented particularly in FIG. 3E, 3G or 3L. In this case, the contact strips 3, 4 and the associated components, with the exception of the contact pads 35, 45, may be omitted.

The semiconductor component 1 of FIG. 3M has, for example, lateral dimensions in a direction perpendicular to the principal emission direction M of at least 0.5 μm and/or at most 3 μm. Along the principal emission direction M, there is an extent of the semiconductor component 1 for example of at least 2 μm and/or at most 15 μm. In a non-limiting embodiment, the semiconductor component 1 may be mechanically handled individually and, for example, is surface-mountable with tweezers or a suction device.

In the semiconductor component 1 of FIG. 3N, three of the semiconductor pillars 2 are combined and mechanically connected by means of the casting body 5. The three semiconductor pillars 2 may be electrically drivable individually or, in contrast to the representation in FIG. 3M, also electrically connected in parallel. In other regards, the comments about FIG. 3M apply.

A plan view of the semiconductor component 1 of FIG. 3N may be seen in FIG. 3O. The three semiconductor pillars 2 are arranged linearly. In contrast to the representation in FIG. 3O, there may also be a triangular arrangement of the semiconductor pillars 2 as seen in plan view. Furthermore, it is also possible for there to be only two of the semiconductor pillars 2 or more than three semiconductor pillars 2 firmly connected to one another in the semiconductor component 1.

The semiconductor component 1 of FIG. 3P corresponds substantially to that of FIG. 3M, the p-contact pad 35 being configured to be radiation-transmissive and the n-contact pad 45 being configured to be reflective. Emission M therefore takes place through the tip 28 and not through the base region 27. For the encapsulation, in particular of the active layer 22, as also in FIG. 3M, the mask layer 6 is still present as passivation.

As also in FIG. 3M, in FIG. 3P the contact pads 35, 45 are possibly molded onto the energization shell 24, the casting body 5 and/or the mask layer 6, such as with a form-fit. To this extent, the representations of FIGS. 3M and 3P are to be understood as schematic.

Corresponding to FIG. 3N, FIG. 3Q represents that a plurality of the semiconductor pillars 2 of FIG. 3P are combined to form a unit. In order to be able to operate the semiconductor pillars 2 electrically independently of one another, it is possible for the energization shells 24 between neighboring semiconductor pillars 2 to be interrupted, so that there is no continuous electrical connection between neighboring semiconductor pillars 2. The same applies to FIG. 3N.

FIGS. 3R and 3S illustrate schematic plan views of the semiconductor components 1, for instance of FIG. 3N or 3Q, or also of semiconductor displays 10. In this case, it is shown that the contact pads 35 are applied next to the semiconductor pillars 2.

According to FIG. 3R, each of the semiconductor pillars 2 is assigned its own contact pad 35, so that the semiconductor pillars 2 can be electrically operated independently. Conversely, in FIG. 3S there are two rows of semiconductor pillars 2, one semiconductor pillar 2 of each of the rows respectively being connected to one of the contact pads 35.

In each case, two of the semiconductor pillars are therefore electrically connected in parallel, as indicated by the schematic circuit diagram in FIG. 3S. A redundant arrangement of the semiconductor pillars 2 may therefore be achieved. A parallel circuit of semiconductor pillars 2, corresponding to that in FIG. 3S, may also be present in all other exemplary embodiments of the semiconductor components 1 and of the semiconductor displays 10. This means that small groups of semiconductor pillars 2 may respectively be combined redundantly to form an electrical unit.

In a non-limiting embodiment, luminescent materials (not shown) are additionally present in the semiconductor components of FIGS. 3N and 3Q. These semiconductor components 1 may therefore be used as RGB units. With such semiconductor components 1, as represented for instance in FIGS. 3M, 3N, 3O, 3P and/or 3Q, it is possible in particular to produce pixel segments which, for instance, may be combined to form a video wall or also to form microdisplays or other displays.

With the method according to FIG. 3 and the semiconductor components 1 and semiconductor displays 10 described in connection therewith, it is also possible to produce a very high density of semiconductor pillars per unit area, for example at least $10^4$ or $10^5$ or $10^6$ semiconductor pillars per $mm^2$. This high surface density of semiconductor pillars 1 is present, in particular, directly on the growth substrate 20.

With the method, described below, of FIGS. 4 and 5, it is possible to reduce the surface density of the semiconductor pillars 2 in the finished semiconductor display 10 and/or in the finished semiconductor components 1, compared with the surface density on the growth substrate 20. In this way, practicable distances may be produced between the semiconductor pillars 2 in the finished components 1, 10, with at the same time efficient and economical manufacturing of the semiconductor pillars 2 on the respective growth substrate 20.

According to the sectional representation of FIG. 4A, the semiconductor cores 21, the active layers 22, the semiconductor shells 23 and the optional additional layers 25 are grown in a relatively dense arrangement out from the openings 61 of the mask layer 6, starting from the n-doped semiconductor layer 41 on the growth substrate 20.

Subsequently, see FIG. 4B, the semiconductor pillars 2 are introduced into a transfer matrix 75. The transfer matrix 75 is formed from a crosslinkable polymer. In the step of FIG. 4B, the transfer matrix 75 has a relatively low viscosity and is liquid.

In the step of FIG. 4C, a mask 77 is applied and cured regions 75, are produced in the transfer matrix 75 by means of illumination with radiation L. Selected semiconductor pillars 2 are therefore firmly embedded into the cured regions 75'.

Subsequently, see FIG. 4D, an auxiliary carrier 71 is applied using a temporary connecting means 72, which is for example an adhesive. In contrast to the representation of FIG. 4D, it is possible for the liquid material of the transfer matrix 75 to have already been removed, so that only the cured regions 75' may remain.

As an alternative to the method steps of FIGS. 4B and 4C, it is possible for a relatively viscous material to be applied for the transfer matrix 75 only over some of the semiconductor pillars 2, so that only selected semiconductor pillars 2 are pressed into the transfer matrix 75. These semiconductor pillars pressed into the transfer matrix 75 correspond to the semiconductor pillars 2 them located in the cured regions 75' in FIG. 4D.

In the optional step of FIG. 4E, interruptions 81, 82 are created. The first interruptions 81 extend through the n-conductive semiconductor layer 41 and the mask layer 6. The second interruptions 82 are limited either to the mask layer 6 or to the n-conductive semiconductor layer 41. It is possible that the production of the interruptions 81, 82 is also already carried out in the method step of FIG. 4A.

FIG. 4F shows that the growth substrate 20 is removed, for instance by means of a laser lift-off method. The removal of the growth substrate 20 may be carried out in such a way that on the one hand the mask layer 6 together with the n-conductive layer 41 remains on the semiconductor pillars 2 in the cured regions 75', see the semiconductor pillar arranged in FIG. 4F on the left. As an alternative, it is possible for only the mask layer 6, but not the n-conductive semiconductor layer 41, to remain on the semiconductor pillars 2, see the middle region in FIG. 4F. Furthermore, both the n-conductive semiconductor layer 41 and the mask layer 6 may be removed from the semiconductor pillars 2 during the detachment of the growth substrate 20, see the configuration on the right in FIG. 4F.

Only some of the semiconductor pillars 2 are therefore detached from the growth substrate 20, see FIG. 4G. The surface density on the auxiliary carrier 71, and therefore in the subsequent display 10 or semiconductor component 1, may be adjusted by means of the proportion and the distance of the semiconductor pillars 2 detached from the growth substrate 20. The semiconductor pillars 2 remaining on the growth substrate 20 are transferred in subsequent process steps onto another auxiliary carrier 71 and/or permanent carrier 7, in a similar way to FIGS. 4B to 4F.

FIG. 4H illustrates that an intermediate carrier 73 is applied on the base regions 27, and optionally the remaining regions of the mask layer 6 and/or of the n-conductive semiconductor layer 41, by means of a further temporary connecting means 72.

Next, see FIG. 4I, the auxiliary carrier 71 is removed and the semiconductor pillars 2 remain on the intermediate carrier 73.

Subsequently, see FIG. 4J, the energization shells 24 are produced continuously as contact sections 32 along the rows R. In this case, the energization shells 24 are applied directly onto the semiconductor materials of the semiconductor pillars 2 and optionally the remaining regions of the mask layer 6 and/or of the n-conductive semiconductor layer 41 as well as the connecting means 72. The application of the energization shells 24 is carried out in a plurality of bands, so that the contact sections 32 for the rows R are formed.

Subsequently, see FIG. 4K, the casting body 5 is produced. The casting body 5 is applied directly onto the energization shells 24 and molds around them directly. In this case, the tips 28 of the semiconductor pillars 2 remain free of the casting body 5.

According to FIG. 4L, the contact sections 32 are applied on the tips 28. The contact sections 32 may extend in rows perpendicularly to the plane of the drawing of FIG. 4L. In a non-limiting embodiment, the contact sections 32 are reflective for the radiation generated during operation.

Optionally, it is possible for interruptions 83 to be made in the energization shells 24 between neighboring rows R. In this way, neighboring rows R may be electrically separated from one another efficiently.

In the method step as shown in the sectional representation of FIG. 4M, the auxiliary carrier 71 is applied onto the casting body 5 and the contact sections 32 with the temporary connecting means 72. Furthermore, the intermediate carrier 73 was removed so that the base regions 27, the remaining regions of the mask layer 6 and optionally the n-conductive semiconductor layer 41 as well as the energization shells 24 are exposed. It is possible for the connecting means 72 to be restricted to regions between neighboring contact sections 32. Therefore, the contact sections 32 may be in direct contact with the auxiliary carrier 71.

According to FIG. 4N, the busbars 46 are applied on the base regions 27. Furthermore, removal of the material of the energization shells 24 follows in regions so that neighboring rows R are no longer electrically connected to one another.

Optionally, it is possible for the auxiliary carrier 71 to be replaced with a permanent carrier 7. The carrier 7 is, for example, a submount which may contain electronic component parts such as transistors for driving the semiconductor pillars 2.

FIG. 4O illustrates an alternative possibility for the routing of the contact strips 3, 4. Along the rows R, a continuous electrical connection takes place through the energization shells 24, which at the same time form the contact sections 32. In this case, the energization shells 24 are made of a reflective metal such as silver.

The busbars 46 of the second energization strips 4 extend perpendicularly to the plane of the drawing of FIG. 4O, and are made of a transparent conductive material such as ITO. There may additionally be busbars (not shown) made of a metal, which are arranged next to the semiconductor pillars 2 in order to conceal them as little as possible. In this case, the busbars 46 are limited to the remaining areas of the mask layer 6 in order to avoid short circuits to the first contact strips 3. No rewiring plane is therefore required on the carrier 7 in the region of the tips 28.

The two contacting schemes are again illustrated summarily in the sectional representations of FIGS. 4P and 4Q. According to FIG. 4P, driving of the semiconductor pillars 2 is carried out by means of the first contact strips 3 bearing on the tips 28 and by means of the second contact strips 4 extending at the base regions 27. The semiconductor pillars 2 are therefore applied between the contact strips 3, 4 along the principal emission direction M.

In contrast, according to FIG. 4Q, all the contact strips 3, 4 extend on the side of the base regions 27 of the semiconductor pillars 2.

By means of through-contacts (not shown), it is possible for the contact pads 35, 45 both in FIG. 4P and in FIG. 4Q to be routed on the carrier 7 or on the side of the auxiliary carrier 71 facing away from the base regions 27. All the contact pads 35, 45 may therefore be located on a side of the semiconductor pillars 2 opposite to the principal emission direction M.

Figure 5:
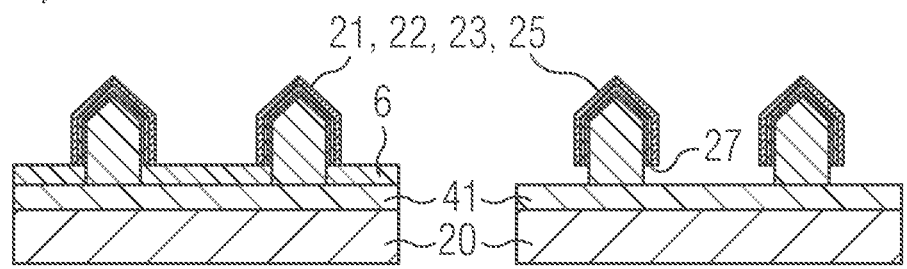
Figure 5:
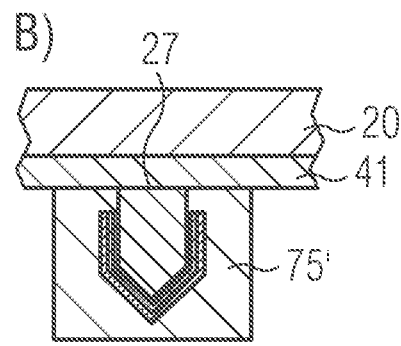
Figure 5:
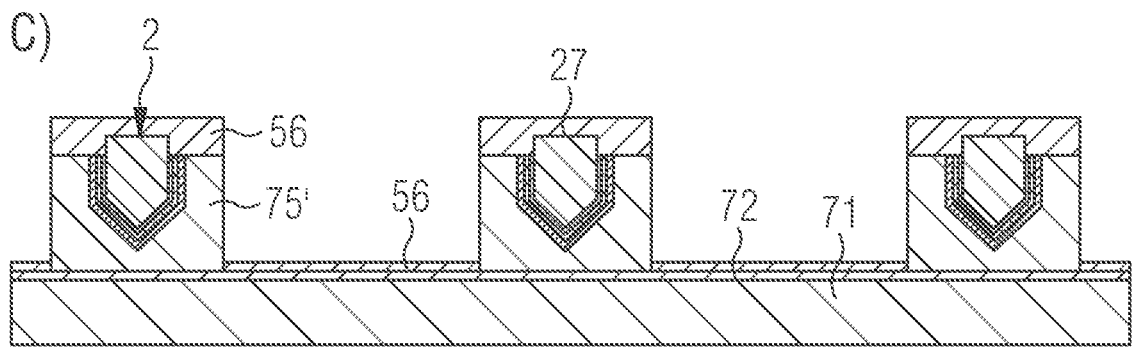
Figure 5:
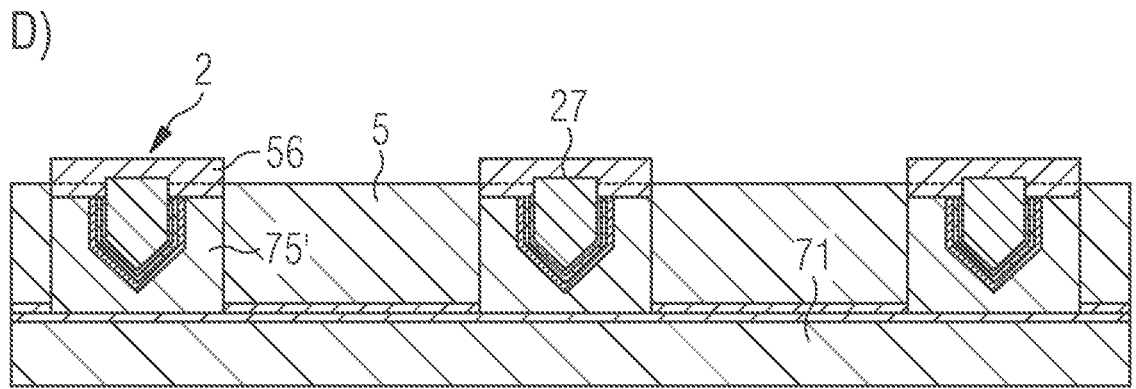
Figure 5:
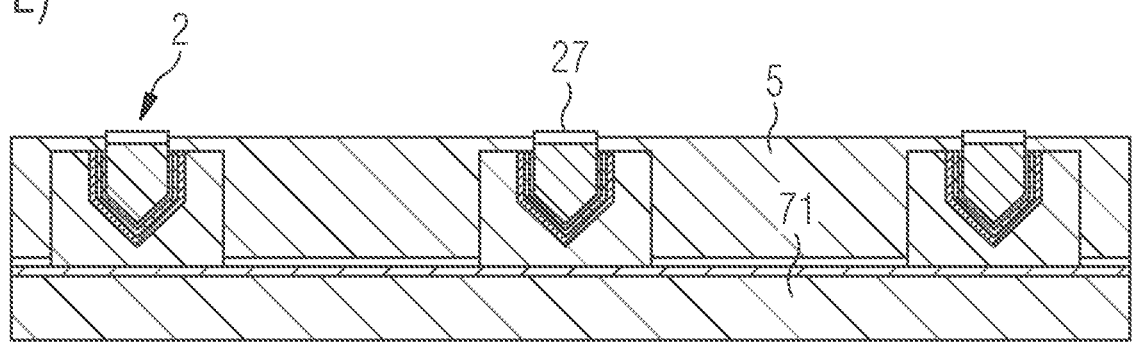
Figure 5:
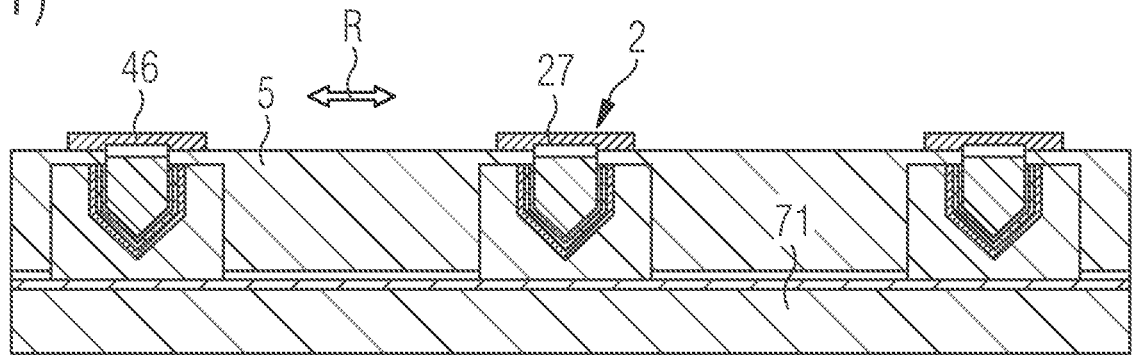
Figure 5:
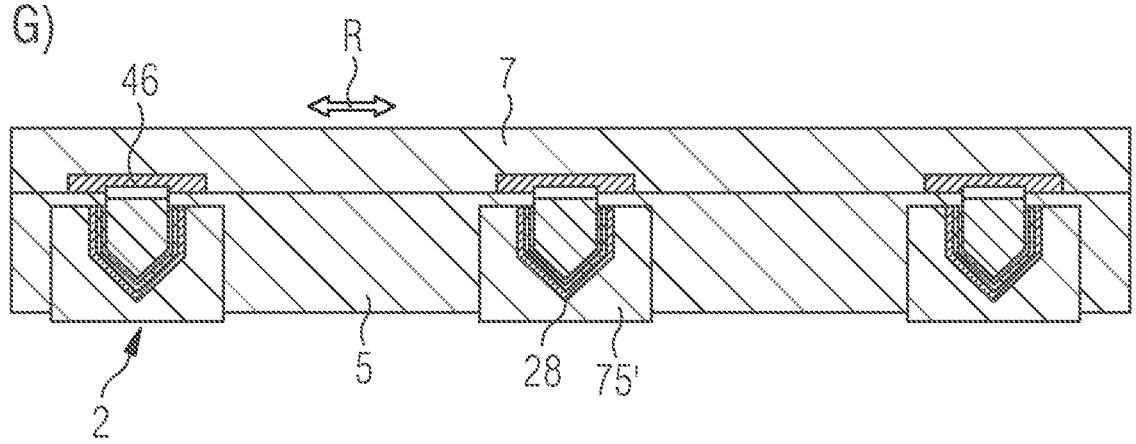
Figure 5:
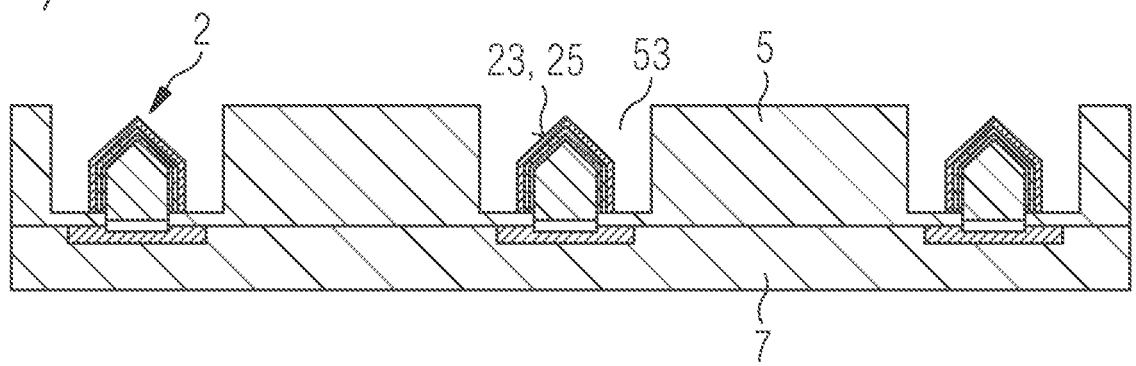
Figure 5:
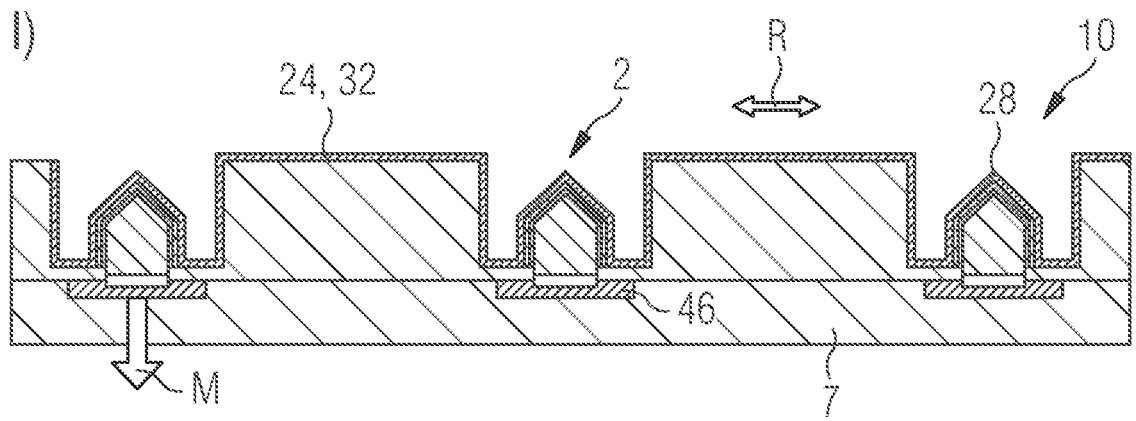
Figure 5:
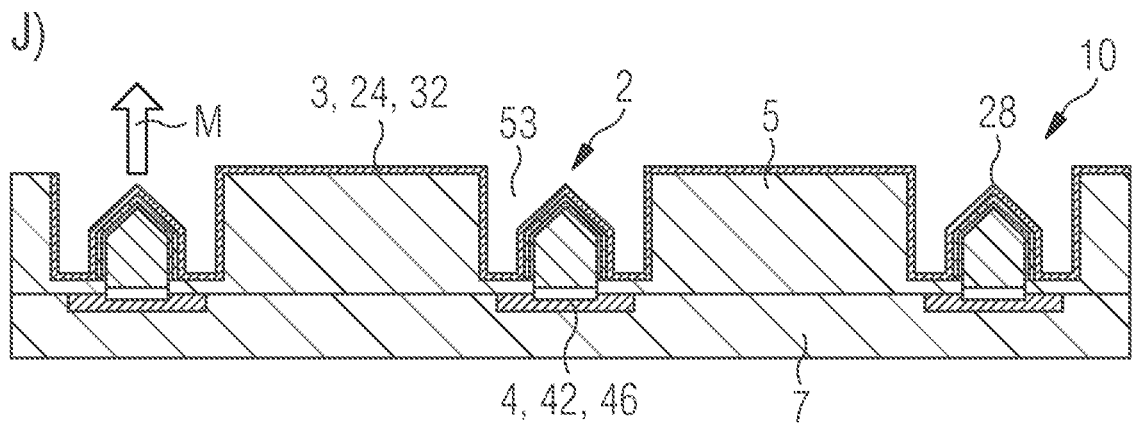

In the method of FIG. 5, the detachment of the semiconductor pillars 2 from the growth substrate 20 is carried out by means of intended fracture positions. Such intended fracture positions may also be referred to as vertical tethers. In this case, the semiconductor pillars 2 are grown according to the sectional representation in FIG. 5A, left-hand side, as explained in connection with the other exemplary embodiments.

Subsequently, see FIG. 5A, right-hand half, the mask layer 6 is removed from all the semiconductor pillars 2, or from those to be detached in the next step. It is therefore possible for there to be narrowing of the semiconductor pillars 2 on the n-conductive semiconductor layer 41. The intended fracture positions may be produced by this narrowing.

FIG. 5B illustrates that a cured region 75' of the transfer matrix 75 is put over particular semiconductor pillars 2. This may be done as explained in connection with FIG. 4. As an alternative, it is possible for particular semiconductor pillars 2 to be pushed into a thermoplastic material for the transfer matrix 75, which is also referred to as hot embossing. In this case, illumination as carried out in FIG. 4C may be obviated. As an alternative, corresponding regions 75' may also be produced around individual semiconductor pillars 2 by means of a printing method.

In this case, it is optionally possible for the cured region 75' to engage into the narrowing of the semiconductor pillars 2 close to the n-conductive semiconductor layer 41, as represented in FIG. 5B. By this engagement into the narrowing, detachment of selected semiconductor pillars 2 from the growth substrate 20 and from the n-conductive semiconductor layer 41 is simplified. As an alternative, such engagement into the narrowing does not take place.

In the optional method step of FIG. 5C, a passivation layer 56 is applied unstructured and surface-wide, in particular by a directional method. The cured regions 75' as well as the base regions 57 are therefore covered by the passivation layer 56.

FIG. 5D illustrates that the casting body 5 is produced. The casting body 5 may in this case be continued at the base regions 27 optionally as far as the semiconductor materials of the semiconductor pillars 2 and therefore extend between the passivation layer 56 and the cured regions 75'. As an alternative, sides of the cured regions 75' facing away from the auxiliary carrier 71 remain entirely free of the casting body 5, so that these sides of the cured regions 75' remain covered only by the passivation layer 56.

FIG. 5E illustrates that the passivation layer 56 is removed, so that the side of the arrangement facing away from the auxiliary carrier 71 is formed by the casting body 5 together with the base regions 27.

FIG. 5F shows that the busbars 46 for the columns C are applied onto the base regions 27. Subsequently, see FIG. 5G, the busbars 46 may be connected to the in particular permanent carrier 7. The tips 28 in this case point away from the optional carrier 7.

In the optional method step of FIG. 5H, the cured regions 75' of the transfer matrix are removed so that recesses 53, in each of which there is one of the semiconductor pillars 2, remain in the casting body 5. The recesses 53 therefore have a different shape than the semiconductor pillars 2 as seen in cross section.

As an alternative, it is possible for the regions 75' to remain in the finished semiconductor components 10. In this case, the regions 75', which are then formed from an optically transmissive material, may be used as optics. Furthermore, such remaining regions 75' may also be provided with luminescent materials in order to carry out conversion of the primary radiation generated in the semiconductor pillars 2.

In the method step of FIG. 5I, the energization shells 24, which also function as current sections 32 along the rows R, are applied. In this case, the energization shells 24 are made of a reflective material. The busbars 46 are at least for the most part optically transmissive, so that emission M takes place through the optional carrier 7 in the direction away from the tips 28.

Conversely, the busbars 46 in FIG. 5J are configured as mirrors 42 and the energization shells 24 are optically transmissive. The emission M therefore takes place in the direction away from the optional carrier 7 through the tips 28. In this case, the casting body 5 is made of a reflective material, such as a silicone filled with titanium dioxide particles, in order to reflect the generated radiation somewhat diffusely or, as an alternative, also specularly.

In the finished semiconductor components 10, a distance between neighboring semiconductor pillars 2 lies in the range of several micrometers to millimeters. This is made possible by means of the distance expansion with the aid of the sequential detachment respectively of some of the semiconductor pillars 2 from the growth substrate 20, as illustrated in FIGS. 4 and 5. In contrast, the semiconductor pillars 2 in the finished components 1, 10 have much smaller lateral dimensions as seen in cross section, for instance in the range of from 0.5 µm to 2 µm, while a distance between neighboring semiconductor pillars 2 in the lateral direction is at least 10 µm or 30 µm and/or at most 200 µm or 50 µm. The same may also apply in all other exemplary embodiments.

Figure 6:
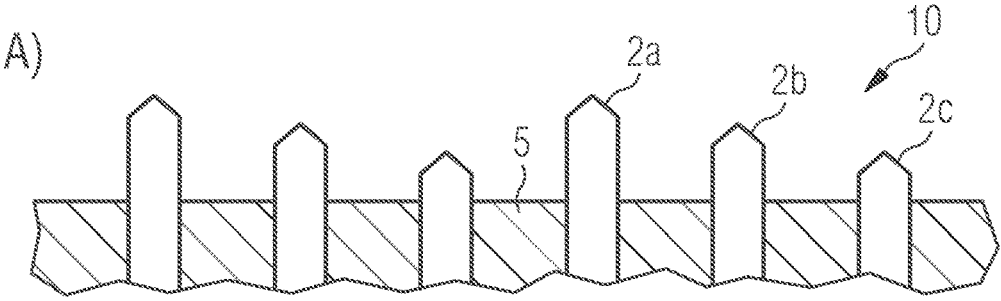
FIG. 6 shows schematic sectional representations of exemplary embodiments of semiconductor displays described here.
Figure 6:
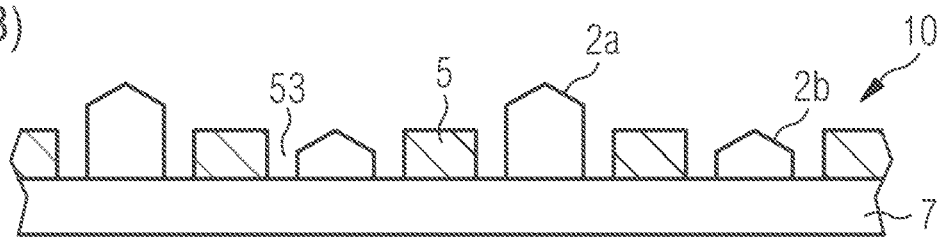
Figure 6:
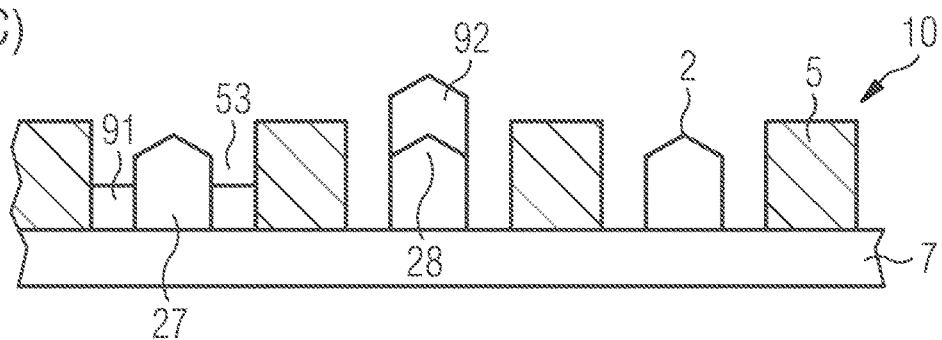
Figure 6:
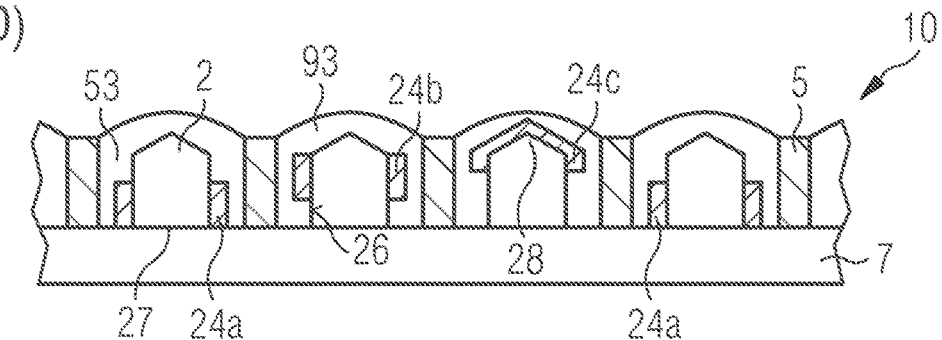
Figure 6:
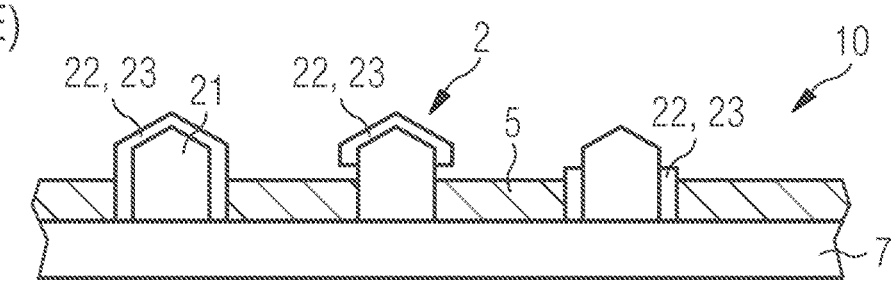
Figure 6:
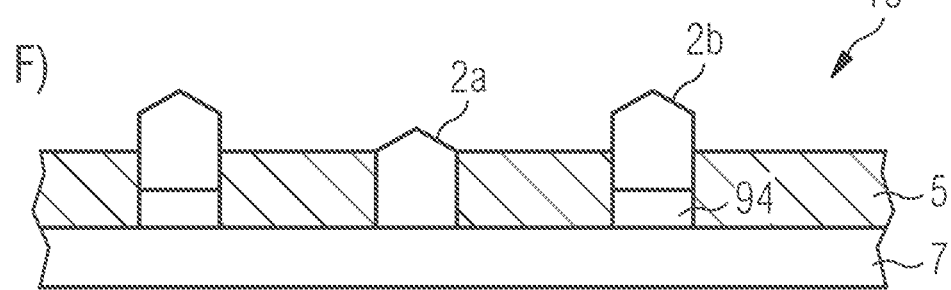
Figure 6:
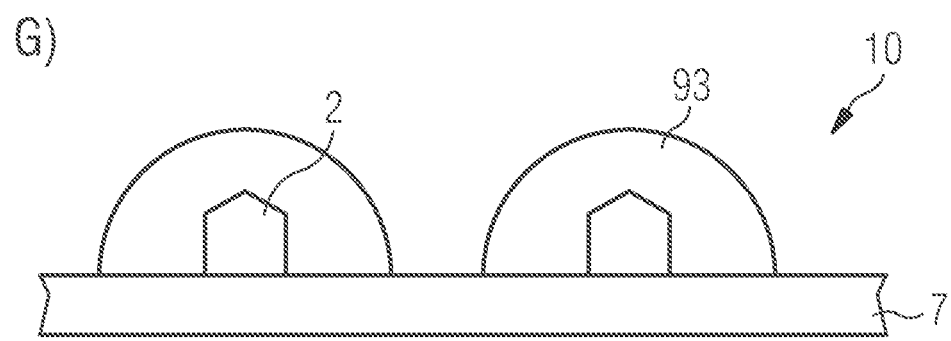
Figure 6:
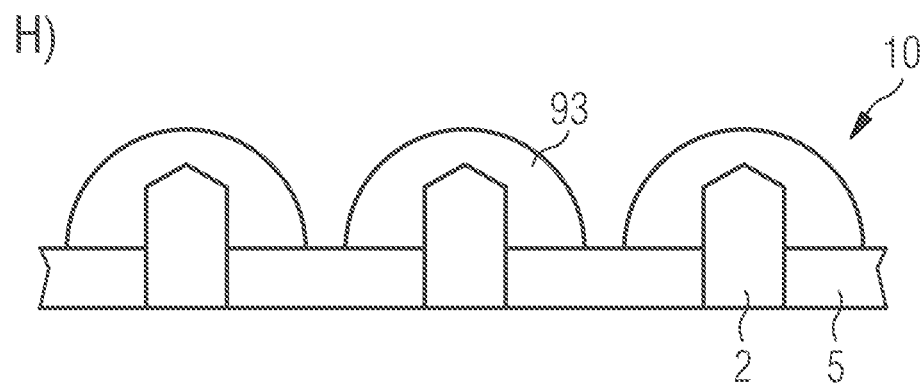
Figure 6:
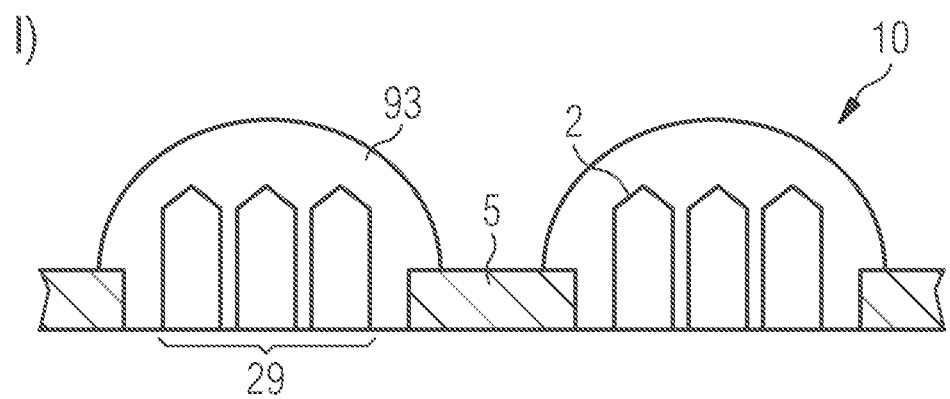
Figure 6:
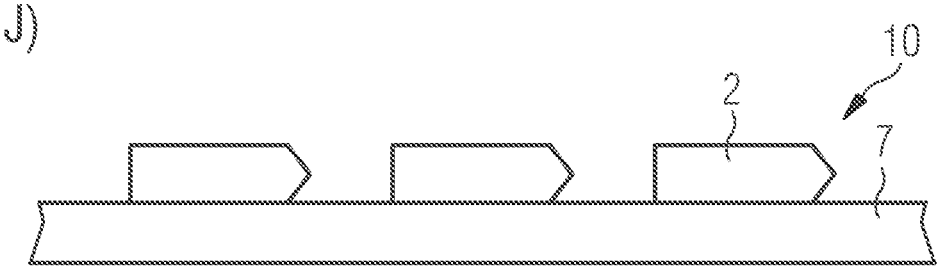
Figure 6:
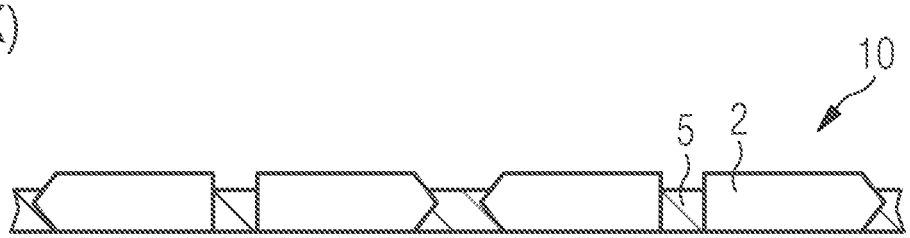
Figure 6:
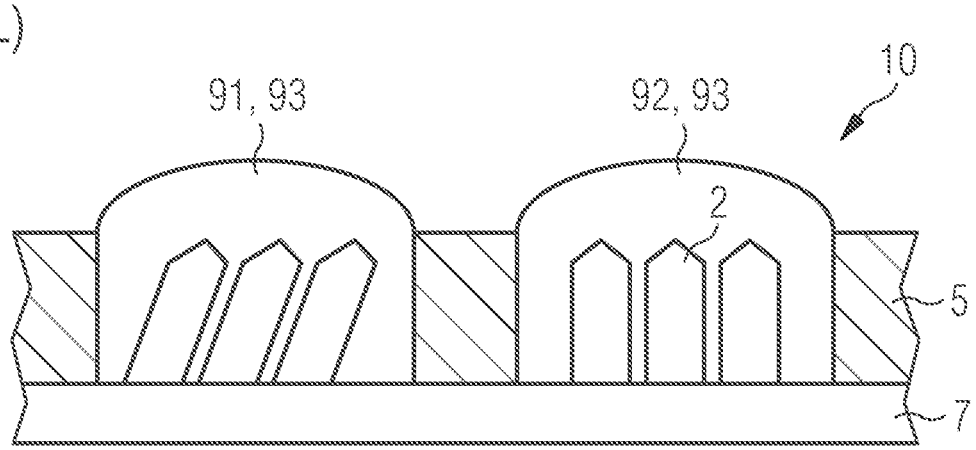

FIG. 6 shows further exemplary embodiments of the semiconductor displays 10, which may apply similarly for the semiconductor components 1. In this case, only the component parts essential for the illustration are respectively shown so that in particular the contact lines 3, 4 and the optionally present insulating body 55 are respectively not represented. The variants shown may be applied correspondingly to the other respective exemplary embodiments.

In the semiconductor displays 10 of FIGS. 6A to 6F, angle-dependent emission by means of the semiconductor pillars 2 takes place at least partially. In this way, for example, a 3D display may be achieved or, for instance for antidazzling, particular angle regions may be darkened or illuminated particularly intensely.

To this end, the semiconductor pillars 2a, 2b, 2c according to FIG. 6A have different heights above the casting body 5. In contrast to FIG. 6A, only two or more than three types of different semiconductor pillars 2a, 2b, 2c may also be present.

FIG. 6B shows that the semiconductor pillars 2a, 2b have different heights above the carrier 7 and above the casting body 5. It is possible for a thickness of the casting body 5 to lie between the heights of the semiconductor pillars 2a, 2b, of which there are for example two types.

FIG. 6C illustrates that the angle dependency of the emission is achieved by different arrangements of luminescent material layers 91, 92. For example, a luminescent material layer 91 fills the recesses 53 starting from the carrier 7, while luminescent material layers 93 of another type are applied onto the tips 28. As an alternative, there may be different filling levels from the carrier 7.

In the exemplary embodiment of FIG. 6D, the energization shells 24a, 24b, 24c are applied on different regions of the semiconductor materials of the semiconductor pillars 2, for instance only on the base regions 27, only in the middles of the semiconductor pillars 2 on the side surfaces 26, or only on the tips 28. The emission characteristic can be adjusted by the in particular metallic, optically opaque energization shells 24a, 24b, 24c. Furthermore, a variation of an energization, in particular a partial energization, of the semiconductor pillars 2 may be achieved.

Optionally, the recesses 53 may be provided with a filler 93, which is configured as optics, for instance as an arrangement of converging lens individually assigned to the semiconductor pillars 2.

In the arrangements in particular of FIGS. 6C and 6D, the carrier 7 may also be omitted, for instance if the recesses 53 are provided with the transparent filler 93 or if sufficient mechanical stability is achieved by the filler 93 together with the casting body 5, or alternatively together with the insulating body or the contact pads, cf. for instance FIG. 1J.

According to FIG. 6E, deactivation of subregions of the semiconductor pillars 2 is carried out. Thus, the active layer 22 is partially removed.

Conversely, the semiconductor pillars 2a, 2b according to FIG. 6F are of equal length but some of them are applied onto mounts 94, so that the semiconductor pillars 2a, 2b protrude to different lengths from the for instance reflective casting body 5.

FIGS. 6G to 6I illustrate different configurations of the filler 93 configured as optics, which may also be present correspondingly in all other exemplary embodiments. According to FIG. 6G, the semiconductor pillars 2 are covered individually by the hemispherical filler 93.

A similar arrangement is found in FIG. 6H, although the filler 93 is applied on the casting body 5. The recesses in the casting body 5 are entirely filled by the semiconductor pillars 2 per se.

Conversely, the filler 93 in FIG. 6I extends continuously and in the shape of a dome over a plurality of the semiconductor pillars 2. The radiation of these semiconductor pillars 2 may therefore be combined, so that a continuous emission region and/or light point per filler 93 is obtained. A number of transparently contactable semiconductor pillars 2 may therefore be applied in a transparent filler 93 as a beam-shaping material, which combines them to form a pixel. The semiconductor pillars 2 emit on all sides, and the emission is shaped by the filler 93.

In FIGS. 6J to 6L, the semiconductor pillars 2 are not arranged upright, but rather recumbent or transversely. In this case, the semiconductor pillars 2 according to FIG. 6J are located on the carrier 7. In FIG. 6K, the semiconductor pillars 2 are accommodated in the casting body 5, which is for example reflective or also optically transmissive.

In the exemplary embodiment of FIG. 6L, there are a plurality of groups 29. Within a group 29, the semiconductor pillars 2 are oriented identically or approximately identically. The semiconductor pillars 2 of different groups 29 may be directed differently to one another.

Figure 4:
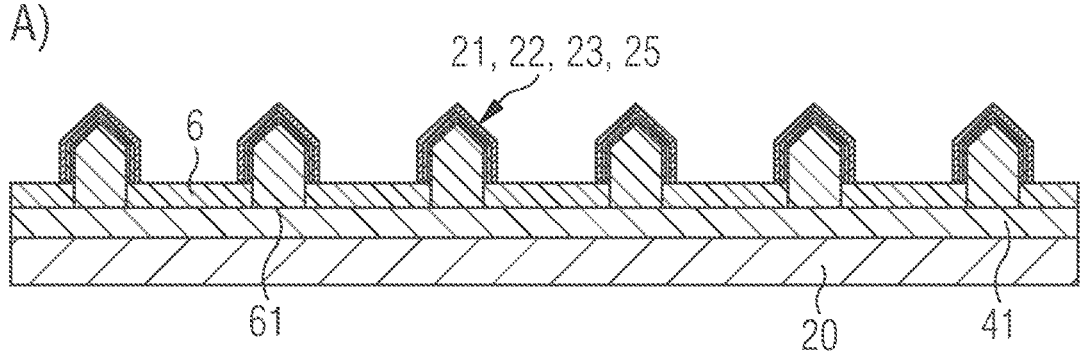
Figure 4:
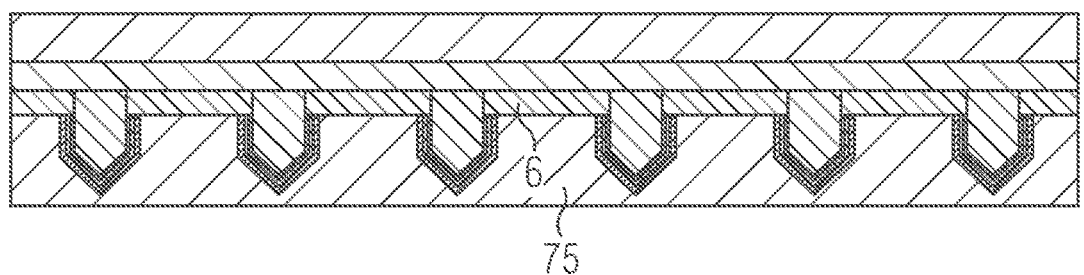
Figure 4:
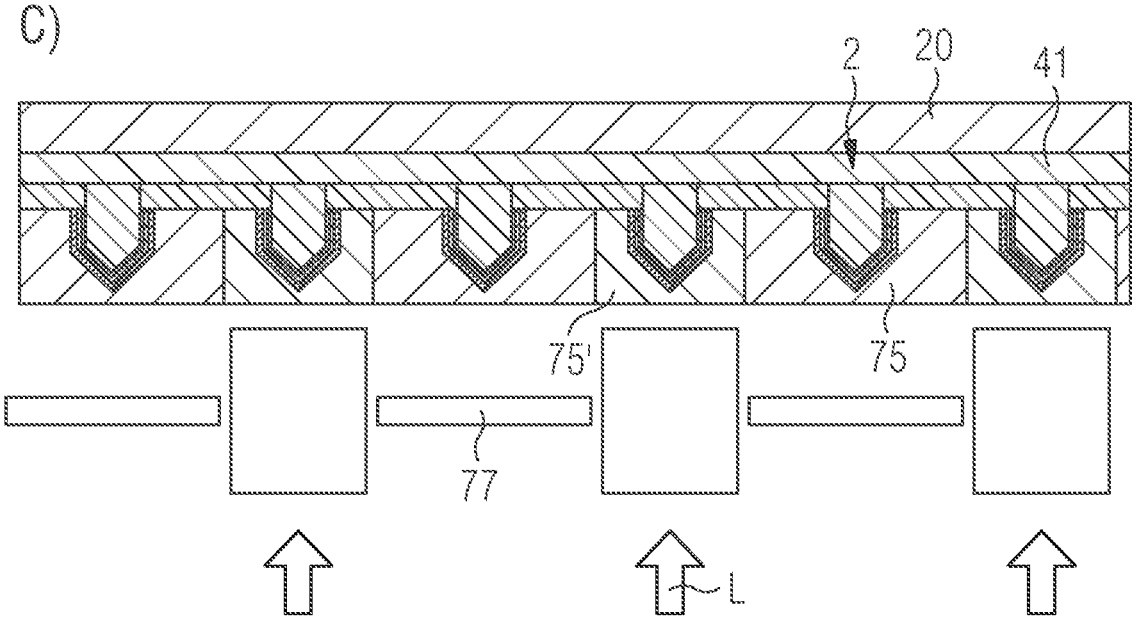
Figure 4:
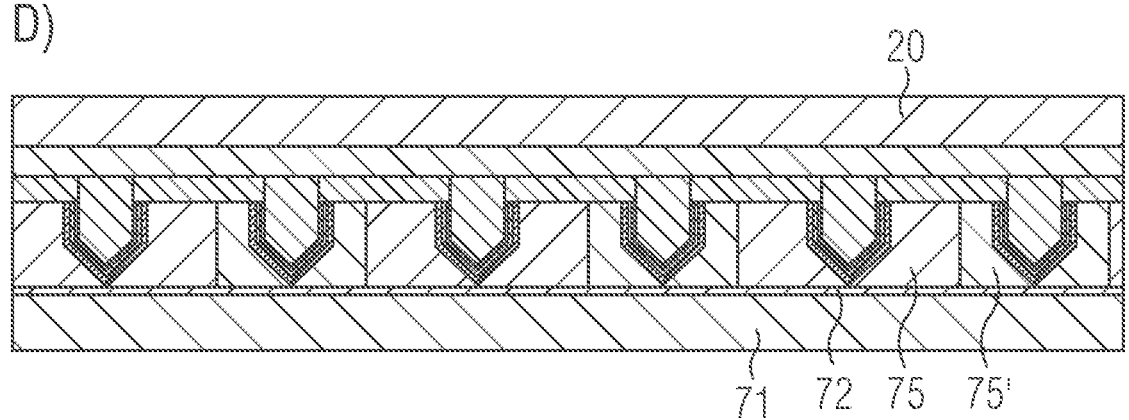
Figure 4:
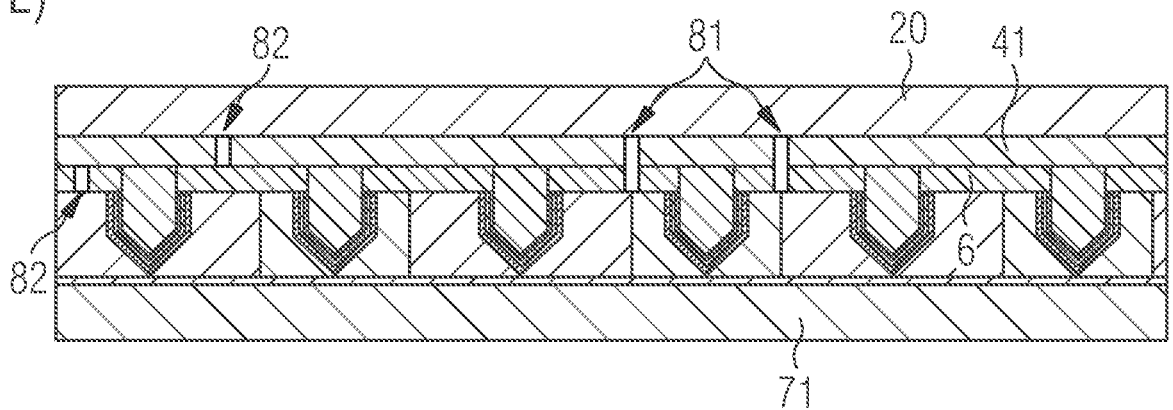
Figure 4:
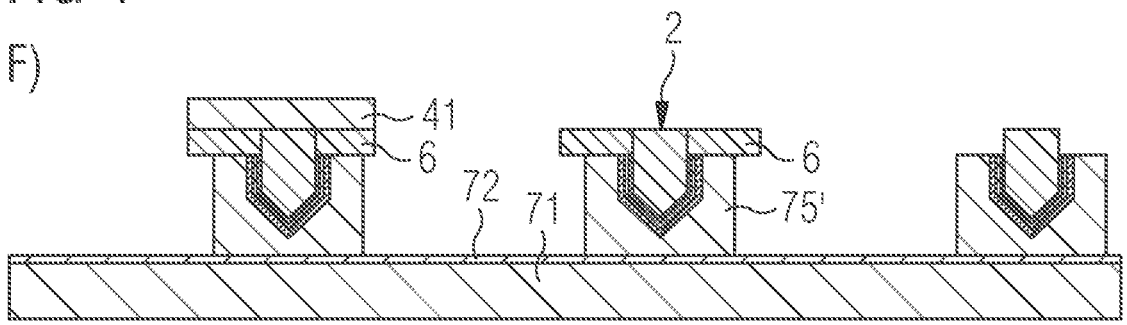
Figure 4:
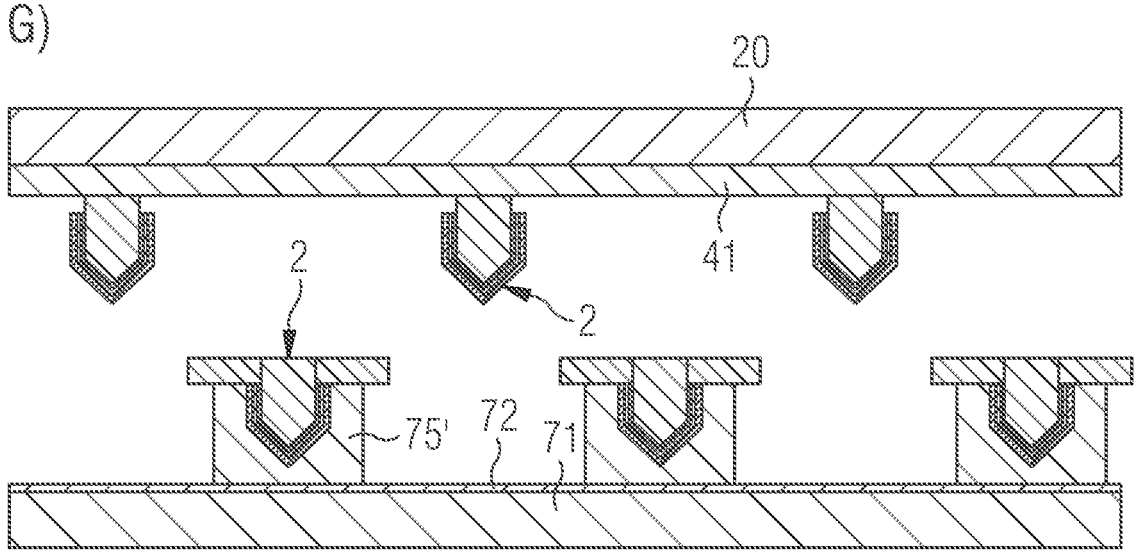
Figure 4:
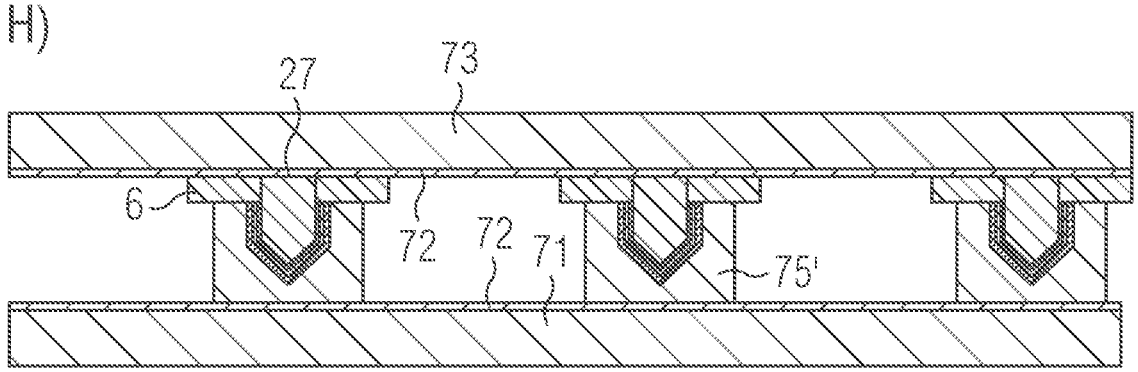
Figure 4:
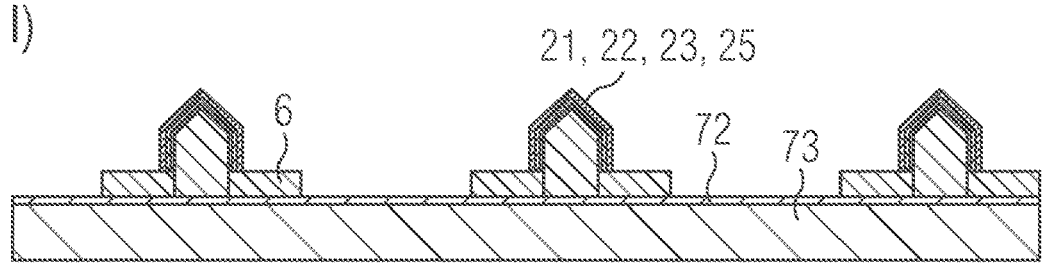
Figure 4:
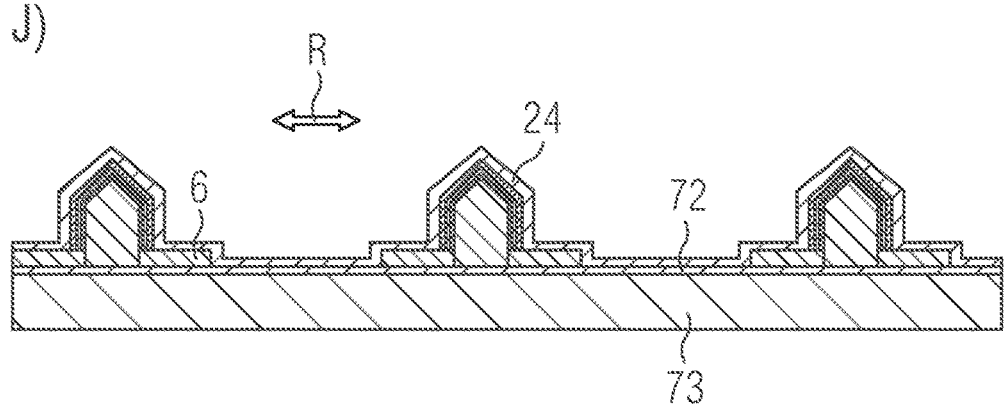
Figure 4:
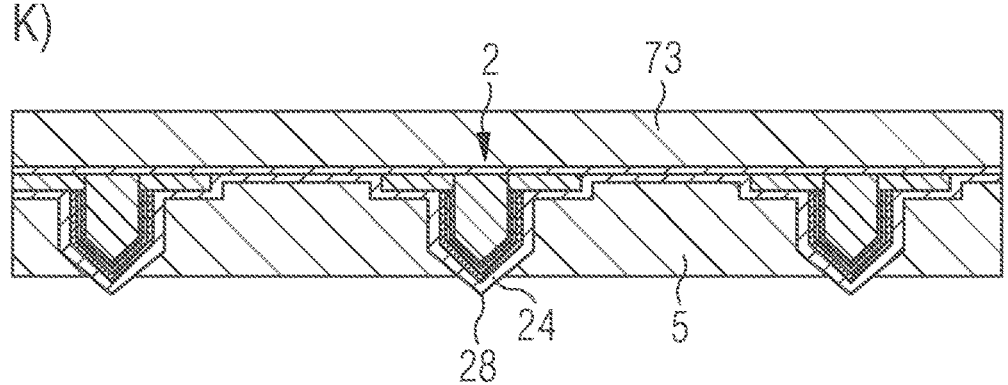
Figure 4:
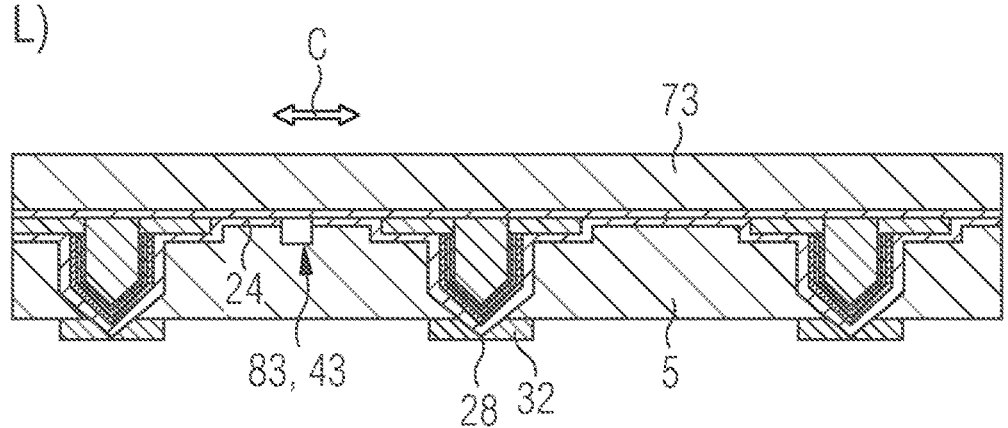
Figure 4:
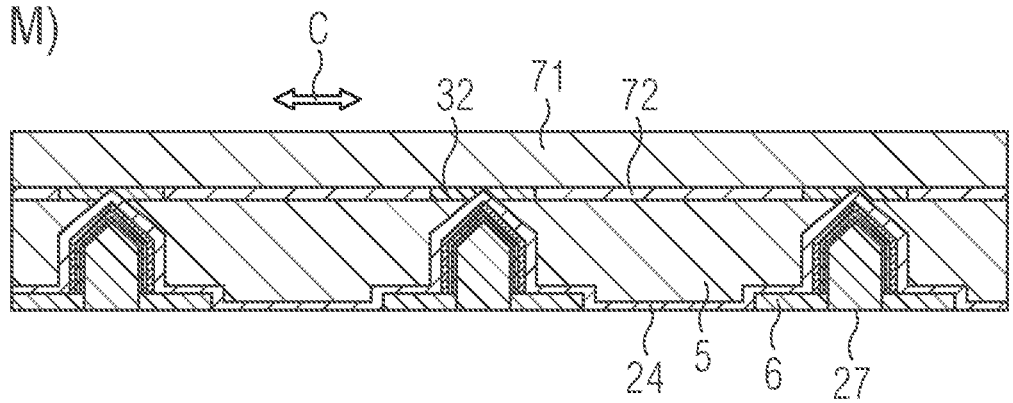
Figure 4:
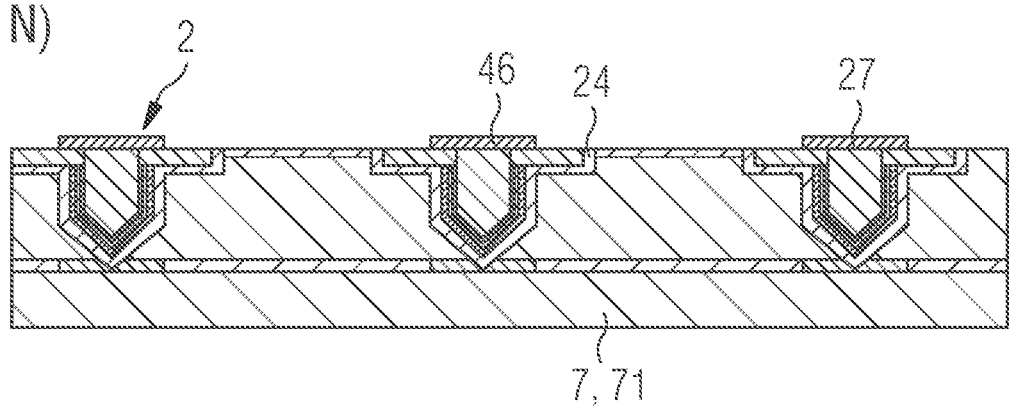
Figure 4:
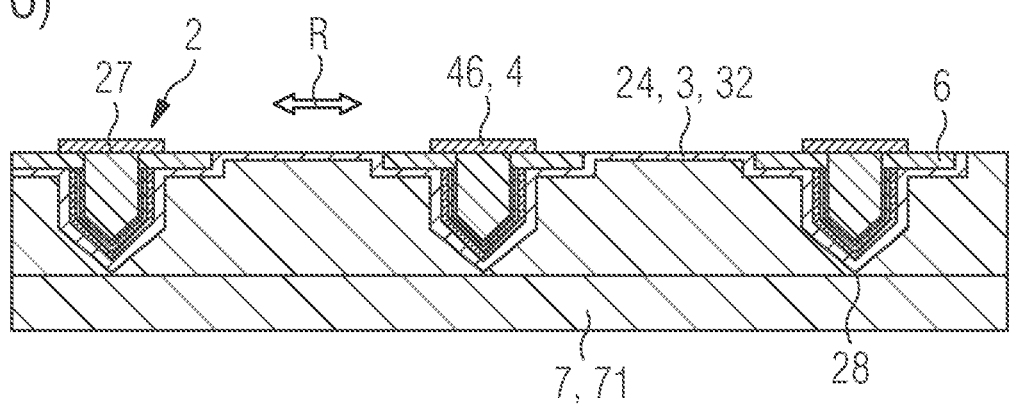
Figure 4:
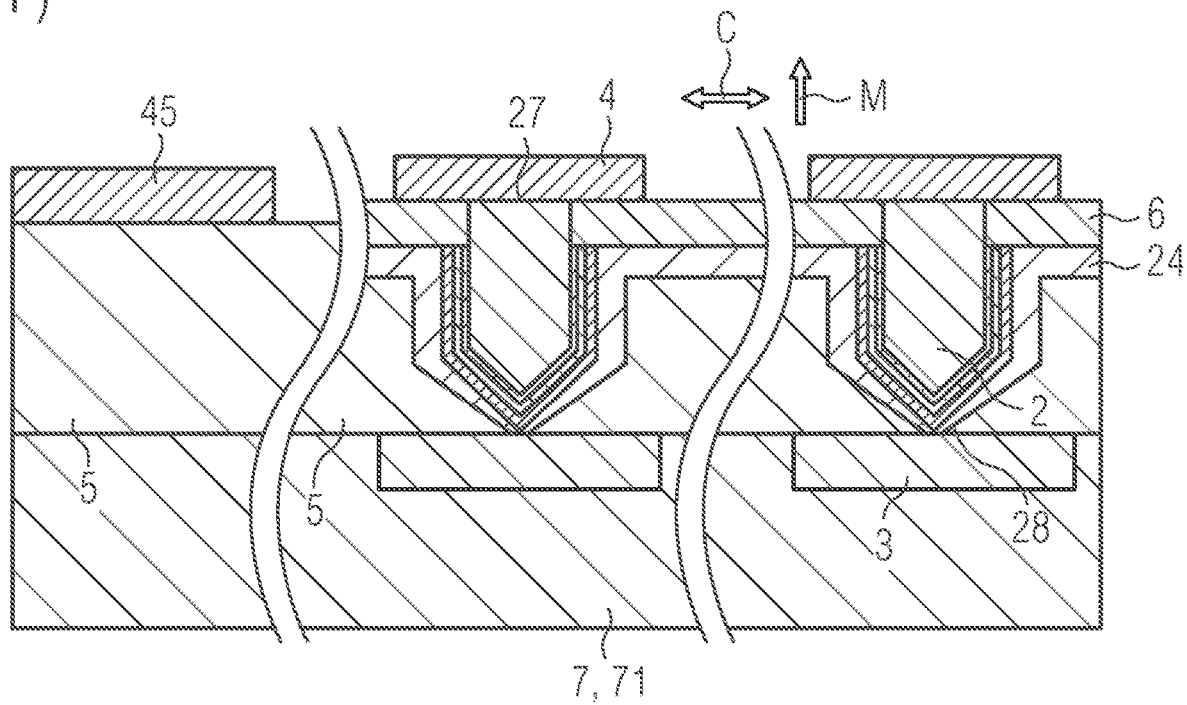
Figure 4:
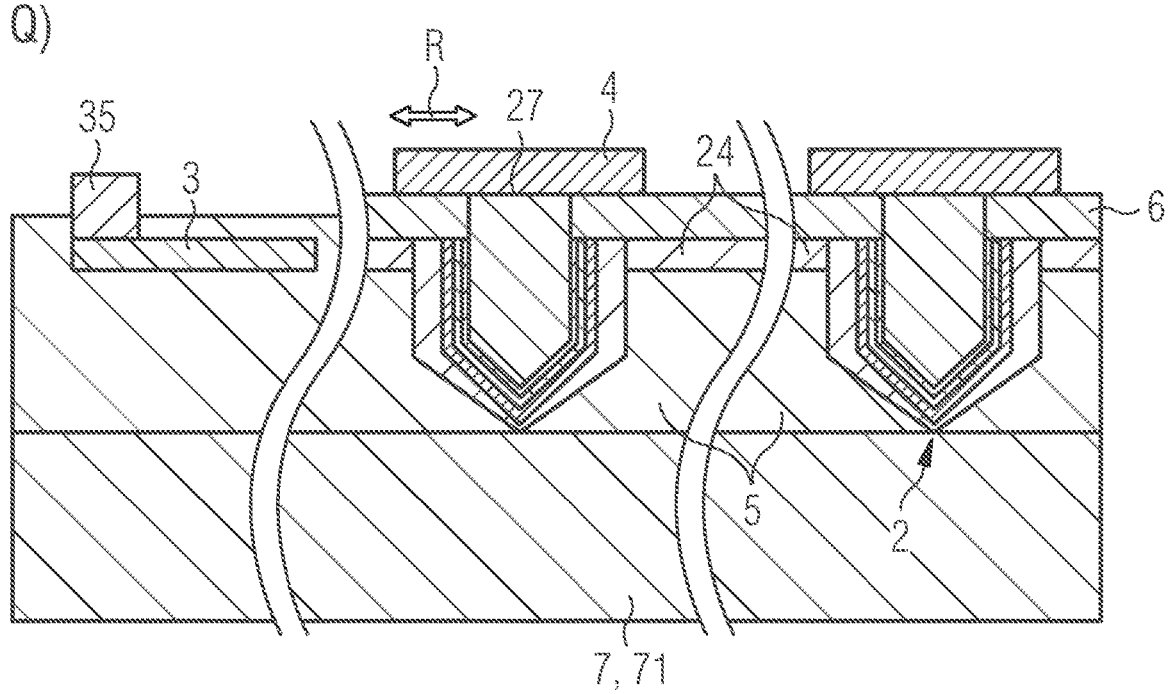
Figure 7:
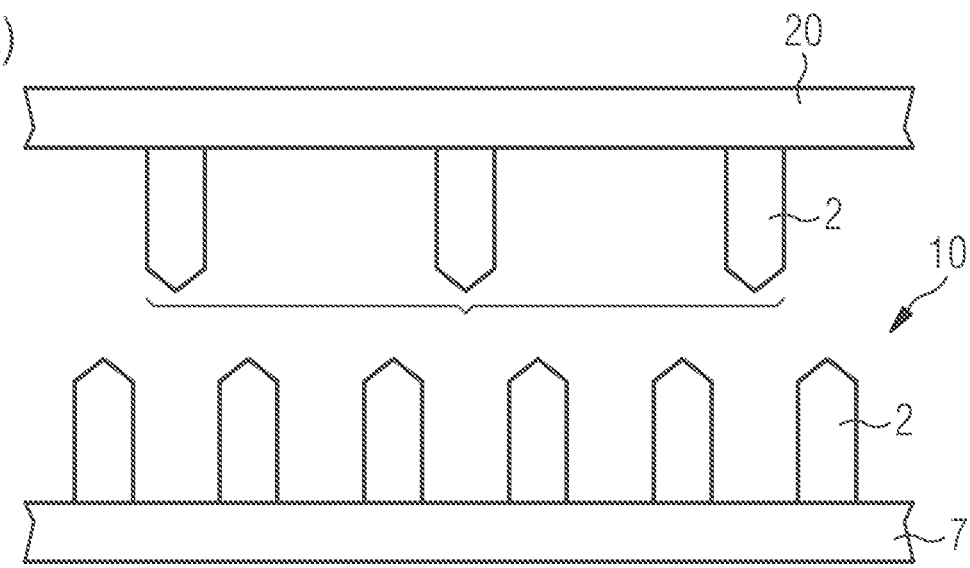
Figure 7:
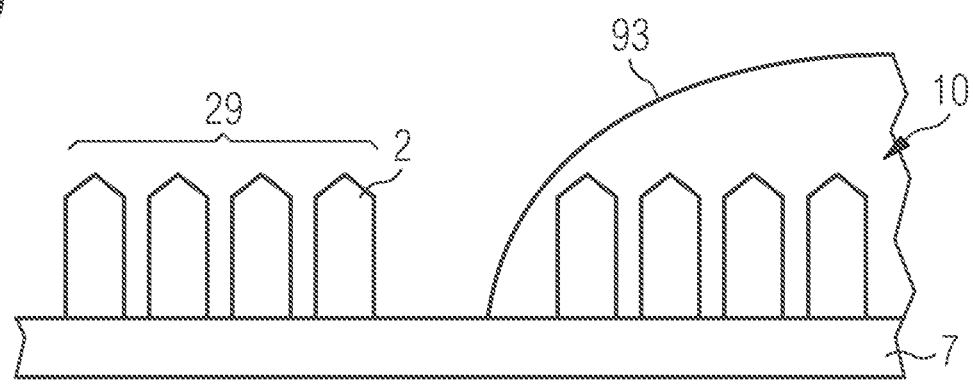
Figure 7:
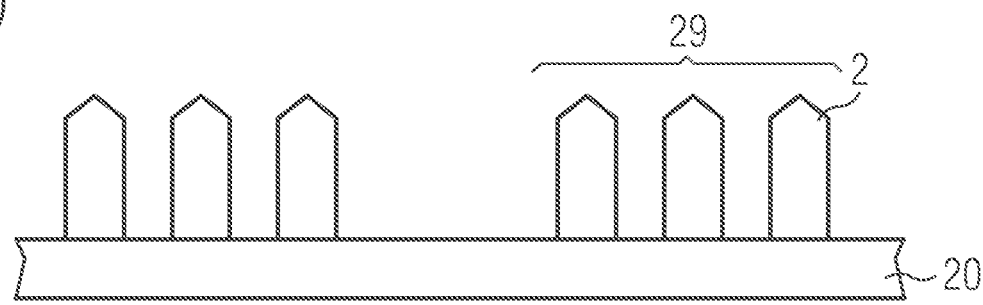

In the methods of FIG. 7, unlike in FIGS. 4 and 5, expansion is not carried out but instead surface compression of the semiconductor pillars 2 is carried out by the transfer from the growth substrate 20, for instance in order to increase the luminance. Thus, the surface density of the semiconductor pillars 2 may be increased after the transfer, for instance onto the carrier 7, for example by a factor of 2, see the outline diagram in FIG. 7A.

For example, the semiconductor pillars 2 may be compressed to more than 10 per square micrometer, individual areas of the semiconductor pillars 2 lying, for example, in the region of from $0.3 \times 0.3$ $\mu m^2 = 0.09$ $\mu m^2$.

In this case, a plurality of semiconductor pillars 2 arranged close together may be combined into a group 29, and these are together used as a pixel or image point or color region of an image point, see FIG. 7B. The distance between the groups 29 may be significantly more than between the semiconductor pillars 2 within the groups 29.

FIG. 7C illustrates that the semiconductor pillars 2 are already grown in a spatially distributed fashion on the growth substrate 20 as is subsequently desired. Thus, grouping of the semiconductor pillars 2 may already be carried out on the growth substrate 20, which may be transferred per se or also expanded or compressed onto a carrier or casting body (not shown).

In a non-limiting embodiment, the components shown in the figures, unless otherwise indicated, respectively directly follow one another in the order specified. Layers which do not touch one another in the figures are separated from one another. If lines are shown as being parallel to one another, the corresponding surfaces are likewise directed parallel to one another. Likewise, unless otherwise indicated, the relative positions of the components shown with respect to one another are reproduced correctly in the figures.

The invention described here is not restricted by the description with the aid of the exemplary embodiments. Rather, the invention includes any new feature and any combination of features, which in particular involves any combination of features in the patent claims, even if this feature or this combination is not itself explicitly indicated in the patent claims or exemplary embodiments.

This patent application claims the priority of German Patent Application 10 2017 113 745.9, the disclosure content of which is incorporated here by reference.

LIST OF REFERENCES 1 optoelectronic semiconductor component
2 Semiconductor pillar
20 growth substrate
21 semiconductor core
22 active layer
23 semiconductor shell
24 energization shell
25 additional layer
26 side surface
27 base region
28 tip
29 group of semiconductor pillars
3 first electrical contact strip (row contacting)
31 through-contact
32 metallic or TCO contact section
35 first electrical contact pad
4 second electrical contact strip (column contacting)
41 n-conductive semiconductor layer
42 mirror
43 electrical through-contact
44 transparent conductive layer
45 second electrical contact pad
46 metal or TCO busbar
47 buffer layer
5 casting body
51 first main side of the casting body
52 second main side of the casting body
53 recess
55 insulating body
56 passivation layer
6 mask layer
61 opening
7 carrier
71 auxiliary carrier
72 temporary connecting means
73 intermediate carrier
74 edge protection
75 transfer matrix
77 mask
81 interruption
82 interruption
83 interruption
91 first luminescent material layer (e.g. for red light)
92 second luminescent material layer (e.g. for green light)
93 filler (optics, lens)
94 mount
10 semiconductor display 12 emission field
M principal emission direction
C column direction
R row direction
L illumination

The invention claimed is:

1. A semiconductor display comprising:
 a multiplicity of semiconductor pillars, and
 first electrical contact strips and second electrical contact strips, and
 at least one casting body that is opaque for the radiation to be generated,
 wherein
  each of the multiplicity of the semiconductor pillars comprises a semiconductor core of a first conductivity type and a semiconductor shell of a second conductivity type different from the first conductivity type, as well as an active layer between the semiconductor core and the semiconductor shell for radiation generation,
  each of the multiplicity of semiconductor pillars comprises an energization shell applied onto the respective semiconductor shell for energization, and
  the multiplicity of semiconductor pillars or small groups of semiconductor pillars can be driven independently of one another by means of the first contact strips and the second electrical contact strips,
  and each of the small groups comprises at most 25 of the semiconductor pillars, and
  at least $10^4$ of the multiplicity of the semiconductor pillars and are located in recesses of the casting body.

2. The semiconductor display as claimed in claim 1, wherein
 at least $10^6$ of the multiplicity of semiconductor pillars are applied in the recesses of the casting body,
 an average diameter of the multiplicity of semiconductor pillars ranges from 40 nm to 5 μm inclusive,
 a ratio of an average height of the semiconductor pillars and the average diameter ranges from 0.5 to 3 inclusive,
 the multiplicity of semiconductor pillars are hexagonal and are grown from a base region and comprise a pyramidal tip opposite the base region,
 the active layer extends continuously over side surfaces and the tip,
 the first contact strips extend perpendicularly to the second contact strips as seen in plan view, and
 each of the small groups of the multiplicity of semiconductor pillars comprises at most 16 of the semiconductor pillars.

3. The semiconductor display as claimed in claim 1, wherein the radiation generated during operation leaves the multiplicity of semiconductor pillars only through the base region in the direction away from the tips.

4. The semiconductor display as claimed in claim 1, wherein the semiconductor pillars protrude from the casting body on two mutually opposite main sides of the casting body.

5. The semiconductor display as claimed in claim 1, wherein the first contact strips extend along rows at the tips, and the multiplicity of semiconductor pillars are electrically contacted at least at the tips.

6. The semiconductor display as claimed in claim 1, wherein the recesses have a different base shape than the multiplicity of semiconductor pillars, as seen in cross section.

7. The semiconductor display as claimed in claim 1, wherein the second contact strips comprise an n-conductive semiconductor layer, from which the multiplicity of semiconductor pillars are grown, the second contact strips being configured as column contacts.

8. The semiconductor display as claimed in claim 7, wherein at least one mirror for reflection of the radiation generated during operation is applied on a side of the n-conductive semiconductor layer facing away from the multiplicity of semiconductor pillars,
 an electrical through-contact in the direction away from the multiplicity of semiconductor pillars being applied on at least one of the mirrors.

9. The semiconductor display as claimed in claim 1, further comprising a mask layer having a multiplicity of openings,
 each of the multiplicity of semiconductor pillars being grown from a respective opening and the openings each being fully covered by the semiconductor pillars, and
 the mask layer being made of an inorganic material and forming a continuous layer with a thickness of at most 10 nm.

10. The semiconductor display as claimed in claim 1, wherein the second contact strips comprise at least one transparent conductive layer,
 the first contact strips being configured to be reflective for the radiation to be generated and the energization shells being contained by the first contact strips.

11. The semiconductor display as claimed in claim 10, wherein the second contact strips additionally comprise at least one metal busbar,
 the semiconductor pillars being located along a principal emission direction respectively between the electrically assigned transparent conductive layer and the assigned busbar, and
 the busbar being freely accessible.

12. The semiconductor display as claimed in claim 1, wherein the multiplicity of semiconductor pillars are located on a growth substrate,
 the first contact strips and the second contact strips being applied on the same side of the growth substrate as the multiplicity of semiconductor pillars.

13. The semiconductor display as claimed in claim 1, further comprising electrical contact pads for external electrical contacting of the first contact strips and the second contact strips, the contact pads being located next to an emission field formed by the multiplicity of semiconductor pillars as seen in plan view, and
 all the contact pads being applied on the same side of the multiplicity of semiconductor pillars, so that the semiconductor display is surface-mountable.

14. The semiconductor display as claimed in claim 13, wherein the electrical contact pads have a greater width than the associated first contact strips and/or second contact strips as seen in plan view.

15. The semiconductor display as claimed in claim 1, wherein the recesses are configured with the same shape as the semiconductor pillars, and the recesses are filled to at least 70% by the multiplicity of semiconductor pillars,
 the casting body directly adjoining the energization shells in places.

16. A production method for a semiconductor display as claimed in claim 1, wherein the method comprises:
 growing the multiplicity of semiconductor pillars on a growth substrate from the openings of the mask layer,
 applying the energization shells on the semiconductor pillars, producing the first contact strips and the second electrical contact strips, and forming the display and/or to forming the semiconductor components.

17. The method as claimed in claim 16, further comprising providing a carrier and transferring only a part of the semiconductor pillars originally grown on the growth substrate onto the carrier, so that an average distance of the multiplicity of semiconductor pillars from one another on the carrier is greater at least by a factor of 2 than on the growth substrate.

18. The method as claimed in claim 17, further comprising:

introducing the semiconductor pillars into a transfer matrix, then solidifying the transfer matrix around some of the semiconductor pillars, then detaching only the semiconductor pillars with the solidified transfer matrix from the growth substrate (20), and then removing the transfer matrix.

19. The method as claimed in claim 16, wherein the multiplicity of semiconductor pillars are grown directly on the mask layer with a smaller diameter than further away from the mask layer and the growth substrate, so that intended fracture positions for detachment of the semiconductor pillars from the growth substrate are formed on the mask layer.

* * * * *